US 009220142B2

(12) United States Patent  
Yano et al.

(10) Patent No.: US 9,220,142 B2  
(45) Date of Patent: Dec. 22, 2015

(54) LIGHT-EMITTING DEVICE

(71) Applicant: CITIZEN ELECTRONICS CO., LTD., Fujiyoshida-shi, Yamanashi-ken (JP)

(72) Inventors: Takakazu Yano, Tokyo (JP); Masato Asahina, Yamanashi-ken (JP); Arata Shimozawa, Otuki (JP); Koichi Fukasawa, Fuefuki (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 523 days.

(21) Appl. No.: 13/646,042

(22) Filed: Oct. 5, 2012

(65) Prior Publication Data

US 2013/0088159 A1 Apr. 11, 2013

(30) Foreign Application Priority Data

Oct. 5, 2011 (JP) .................................. 2011-220729

(51) Int. Cl.
*H05B 37/00* (2006.01)
*H05B 33/08* (2006.01)

(52) U.S. Cl.
CPC ........ *H05B 33/0845* (2013.01); *H05B 33/0821* (2013.01); *H01L 2224/48091* (2013.01)

(58) Field of Classification Search
USPC ........... 315/86, 87, 88, 89, 90, 119, 121, 122, 315/123, 185 R, 192, 291, 297, 312
See application file for complete search history.

(56) References Cited

U.S. PATENT DOCUMENTS 9,146,026 B2 *  9/2015  Funakubo ............... F21V 21/00
2015/0226387 A1 *  8/2015  Shimozawa ............. F21K 9/56
                                                              362/84

FOREIGN PATENT DOCUMENTS

| JP | 2005-117028 A | 4/2005 |
| JP | 2008-140921 A | 6/2008 |
| JP | 2010-287657 A | 12/2010 |
| JP | 2011-014836 A | 1/2011 |

OTHER PUBLICATIONS

Japanese Notice of Reasons for Refusal JP Appln. No. 2011-220729 dated Jul. 22, 2015.

* cited by examiner

*Primary Examiner* — Douglas W Owens
*Assistant Examiner* — Jianzi Chen
(74) *Attorney, Agent, or Firm* — Browdy and Neimark, PLLC

(57) ABSTRACT

A light-emitting device includes a mounting area that includes a first end and a second end opposite to the first end, a first electrode group disposed adjacent to the first end of the mounting area, a second electrode group disposed adjacent to the second end of the mounting area, a plurality of files each in that a plurality of light-emitting elements are arranged in the mounting area to extend from a vicinity of the first end of the light-emitting area to a vicinity of the second end of the mounting area and electrically connected in series with each other of the light-emitting elements in each file. Light-emitting elements included in two or more files can be a light-emitting block to be lighted together through electrodes of the first electrode group and the second electrode group.

17 Claims, 16 Drawing Sheets

LIGHT-EMITTING DEVICE

CROSS-REFERENCE TO RELATED APPLICATION

This application is based on and claims the priority benefit of Japanese Patent Application No. 2011-220729, filed on Oct. 5, 2012, the disclosure of which is incorporated herein by reference in its entirety.

BACKGROUND OF THE INVENTION

1. Field of the Invention

The present invention relates to a light-emitting device including a plurality of files arranged in parallel, each having a plurality of light-emitting elements which are arranged in a mounting area on which the light-emitting elements are mounted and which are connected in series to each other.

2. Description of the Related Art

In recent years, light-emitting sources each including a plurality of arranged light-emitting elements have been used as light-emitting sources for illumination. As the light-emitting elements, light-emitting diode elements (LED elements) are often employed because it has a less power consumption and a long operating life for lighting. Because the LED elements are a point light source, it is required that a plurality of LED elements is used to be arranged to satisfy a request for desired brightness or light-emitting range necessary to light sources for illumination. In a light-emitting device in which a plurality of LED elements are arranged, if the number of the arranged LED elements is large, there is a case where the LED elements are formed in a group unit or block unit in which some LED elements are packed (for example, see JP2011-014836A and JP2010-287657A).

A light-emitting device disclosed in JP2011-014836A has a configuration in which a plurality of LED element groups each having a plurality of LED elements arranged is connected in parallel with each other. Each LED element group is composed of LED elements of different number. A connection manner of a first LED element group and a second LED element group to a power source is configured to be changed such that a resistance value obtained by combining values of the first LED element group and the second LED element group depending on a source voltage is varied. In addition, the connection manner of the LED element groups are performed by exchanging a voltage supplied from the power source selectively.

On the other hand, JP2010-287657A discloses a light-emitting module in which a plurality of light-emitting elements is arranged in light-emitting areas. The light-emitting module includes a plurality of light-emitting areas and a plurality of electrodes. LED elements of the number depending on a size of each light-emitting area are connected in series in the light-emitting area, and a voltage is supplied to the light-emitting area through a pair of electrodes for power-feeding of the plurality of electrodes. The pair of electrodes for power-feeding includes a pair of power-feeding terminals between which a supply power is connected.

As mentioned above, although some LED elements are arranged by dividing them in a plurality of element arrays, a source voltage supplied to the plurality of element arrays is performed by the pair of electrodes for power-feeding. However, if lighting is driven by pair of electrodes for power-feeding, because a common voltage is supplied to all of the LED element arrays, the entire brightness is constantly maintained, but it is not easy to limit partially light-emitting areas or brightness.

In JP2011-014836A, the brightness or light-emitting arrays can be adjusted by providing a switch element or resistance element on each LED array unit. However, parts of the switch element or resistance element and so on other than the LEDs are required. On the other hand, in JP2010-287657A, if the brightness is adjusted, it is necessary to adjust variably the source voltage connected between the pair of power-feeding terminals.

In this way, the conventional light-emitting devices using the LED elements does not disclose a structure to light LED elements in one or more files independently and to light LED elements in files as a block. in a predetermined array unit. In particular, if a plurality of LED elements is arranged in an area, there is no existing light-emitting device in which LED elements are arranged and lighting can be controlled so that brightness can be adjusted in a stepwise fashion in a state where entire lighting balance is maintained.

SUMMARY OF THE INVENTION

The present invention is proposed in view of such conventional devices as above-described. A light-emitting device according to an embodiment of the present invention includes a mounting area that includes a first end and a second end opposite to the first end, a first electrode group disposed adjacent to the first end of the mounting area, a second electrode group disposed adjacent to the second end of the mounting area, a plurality of files each in that a plurality of light-emitting elements are arranged in the mounting area to extend from a vicinity of the first end of the light-emitting area to a vicinity of the second end of the mounting area and electrically connected in series with each other of the light-emitting elements in each file. Light-emitting elements included in two or more files can be a light-emitting block to be lighted together through electrodes of the first electrode group and the second electrode group.

DETAILED DESCRIPTION OF THE EMBODIMENTS

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

Figure 1:
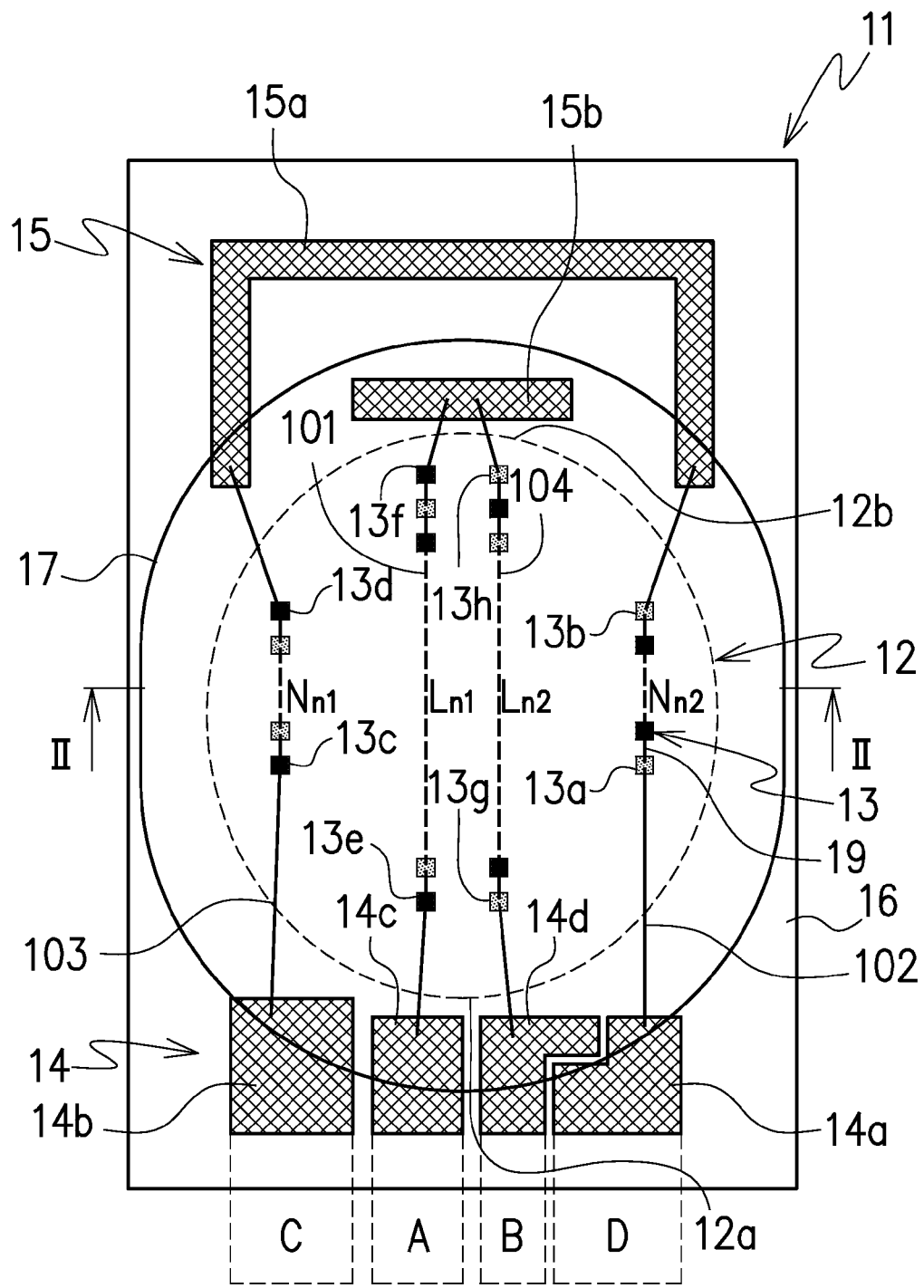
FIG. 1 is a plan view showing a light-emitting device according to a first embodiment of the present invention.
Figure 2:
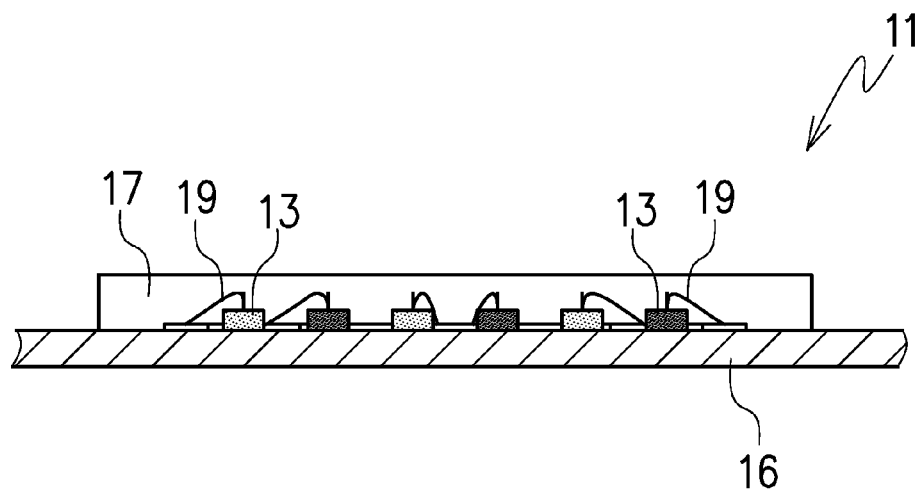
FIG. 2 is a sectional view taken along line II-II the light-emitting device shown in FIG. 1.
Figure 3:
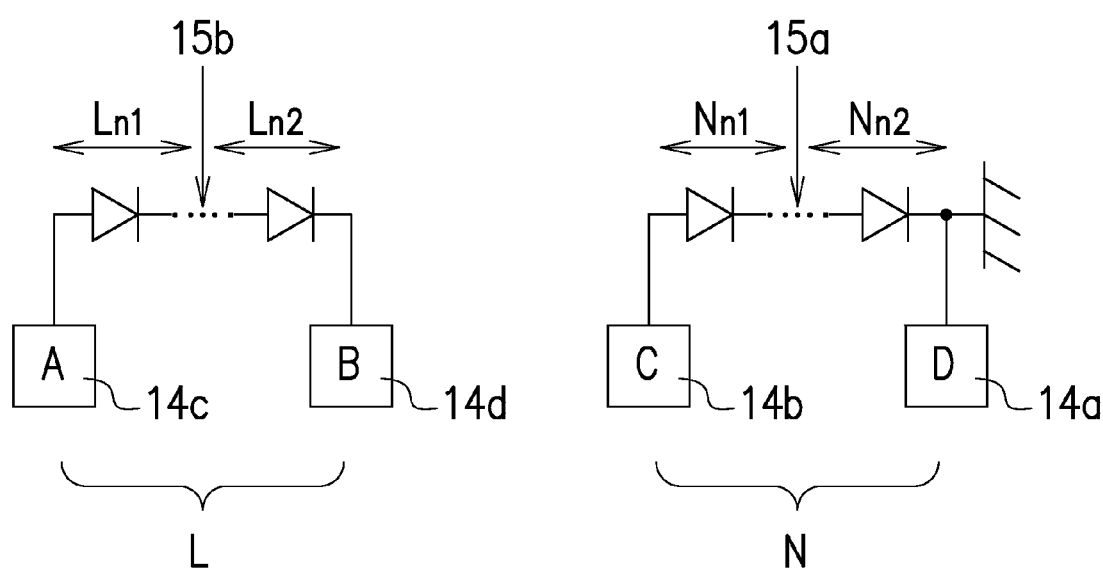
FIG. 3 is a view showing an equivalent circuit of the light-emitting device shown in FIG. 3.

FIGS. 1 to 3 illustrate a first embodiment of a light-emitting device according to the present invention.

The light-emitting device 11 according to the first embodiment includes a mounting area 12 that includes a first end 12a and a second end 12b opposite to the first end 12a, a first electrode group 14 disposed adjacent to the first end 12a of the mounting area 12, a second electrode group 15 disposed adjacent to the second end 12b of the mounting area 12, a first file 101 in that a plurality of LED elements 13 are arranged to extend from a vicinity of the first end 12a of the mounting area to a vicinity of the second end 12b of the mounting area 12 and electrically connected in series with each other of the LED elements 13 of the first file 101, a second file 102 disposed at a right side of the first file 101 in parallel with the first file 101, the second file 102 in that a plurality of LED elements 13 are arranged to extend from the vicinity of the first end 12a of the mounting area 12 to the vicinity of the second end 12b of the mounting area 12 and electrically connected in series with each other of the LED elements 13 of the second file 102, and a third file 103 disposed at a left side of the first file 101 in parallel with the first file 101, the third file 103 in that a plurality of LED elements 13 are arranged to extend from the vicinity of the first end 12a of the mounting area 12 to the vicinity of the second end 12b of the mounting area 12 and electrically connected in series with each other of the LED elements 13 of the third file 103. The first electrode group 14 includes a first electrode 14a and a second electrode 14b that are disposed adjacent to the first end 12b of the mounting area 12. The second electrode group 15 includes a first electrode 15a.

A first LED element 13a included in the second file 102 and positioned adjacent to the first end 12a of the mounting area 12 is electrically connected in series by a metallic wire to the first electrode 14a of the first electrode group 14, and a second LED element 13b included in the second file 102 and positioned adjacent to the second end 12b of the mounting area 12 is electrically connected in series by a metallic wire to the first electrode 15a of the second group 15. There are one or more LED elements 13 lined up between the first LED element 13a and the second LED element 13b of the second file 102 to be the second file 102. In the second file 102, the LED elements 13 each with a pair of element electrodes are electrically connected in series by metallic wires to neighboring LED elements 13 in the second file 102, the first LED element 13a is electrically connected in series by the metallic wire to the first electrode 14a of the first electrode group 14, and the second LED element 13b is electrically connected in series by the metallic wire to the first electrode 15a of the second electrode group 15.

A first LED element 13c included in the third file 103 and positioned adjacent to the first end 12a of the mounting area 12 is electrically connected in series to by a metallic wire to the second electrode 14b of the first electrode group 14, and a second LED element 13d included in the third file 103 and positioned adjacent to the second end 12b of the mounting area 12 is electrically connected in series by a metallic wire to the first electrode 15a of the second electrode group 15.

There are one or more LED elements 13 lined up between the first LED element 13c and the second LED element 13d of the third file 103 to be the third file 103. In the third file 103, the LED elements 13 each with a pair of element electrodes are electrically connected in series by metallic wires to neighboring LED elements 13 in the third file 103, the first LED element 13c is electrically connected in series by the metallic wire to the second electrode 14b of the first electrode group 14, and the second LED element 13d is electrically connected in series by the metallic wire to the first electrode 15a of the second electrode group 15.

The number of the LED elements 13 included in the first file 101 is more than the number of the LED elements 13 included in the second file 102.

The number of the LED elements 13 included in the first file 101 is more than the number of the LED elements 13 included in the third file 103.

The number of the LED elements 13 included in the second file 102 is the same as the number of the LED elements included in the third file 103.

As the LED elements 13 included in the second file 102 and the LED elements 13 included in the third file 103 are electrically connected in series to the first electrode 14a and the second electrode 14b of the first group electrode 14 via the first electrode 15a of the second electrode group 15, the LED elements 13 included in the second file 102 and the LED elements 13 included in the third file 103 are a light-emitting block to be lighted together.

The light-emitting device 11 further includes a fourth file 104 in that a plurality of LED elements 13 are arranged to extend from the vicinity of the first end 12a of the mounting area 12 to the vicinity of the second end 12b of the mounting area 12 and electrically connected in series with each other of the LED elements 13 of the fourth file 104. The first electrode group 14 further may include a third electrode 14c and a fourth electrode 14d. Also, the second electrode group 15 further may include a second electrode 15b.

A first LED element 13e of the plurality of LED elements 13 included in the first file 101 and positioned adjacent to the first end 12a of the mounting area 12 is electrically connected in series by a metallic wire to the third electrode 14c of the first electrode group 14, and a second LED element 13f of the plurality of LED elements 13 included in the first file 101 and positioned adjacent to the second end 12b of the mounting area 12 is electrically connected in series by a metallic wire to the second electrode 15b of the second electrode group 15.

There are one or more LED elements 13 lined up between the first LED element 13e and the second LED element 13f of the first file 101 to be the first file 101. In the first file 101, the LED elements 13 each with a pair of element electrodes are electrically connected in series by metallic wires to neighboring LED elements 13 in the first file 101, the first LED element 13e is electrically connected in series by the metallic wire to the third electrode 14c of the first electrode group 14, and the second LED element 13f is electrically connected in series by the metallic wire to the second electrode 15b of the second electrode group 15.

A first LED element 13g of the plurality of LED elements 13 included in the fourth file 104 and positioned adjacent to the first end 12a of the mounting area 12 is electrically connected in series by a metallic wire to the fourth electrode 14d of the first electrode group 14, and a second LED element 13h of the plurality of LED elements 13 included in the fourth file 104 and positioned adjacent to the second end 12b of the mounting area 12 is electrically connected in series by a metallic wire to the second electrode 15b of the second electrode group 15.

There are one or more LED elements 13 lined up between the first LED element 13g and the second LED element 13h of the fourth file 104 to be the fourth file 104. In the fourth file 104, the LED elements 13 each with a pair of element electrodes are electrically connected in series by metallic wires to neighboring LED elements 13 in the fourth file 104, the first LED element 13g is electrically connected in series by the metallic wire to the fourth electrode 14d of the first electrode group 14, the second LED element 13h is electrically connected in series by the metallic wire to the second electrode 15b of the second electrode group 15.

The LED elements 13 included in the first file 101 and the LED elements 13 included in the fourth file 104 are electrically connected in series by the metallic wire to the third electrode 14c and the fourth electrode 14d of the first electrode group 14 through the second electrode 15b of the second electrode group 15.

In this embodiment, the mounting area 12 includes an elliptic shape, the first end 12a of the mounting area 12 includes an elliptic arc, and the second end 12b of the mounting area 12 includes an elliptic arc.

As the LED elements 13 included in the first file 101 and the LED elements 13 included in the third file 103 are electrically connected in series to each other and to the two electrodes (as the third electrode 14c and the fourth electrode 14d in FIGS. 1, 2, 5, 6, 9, 10, 11, 12 or as the third electrode 34c and the first electrode 34a in FIGS. 13, 14) of the first electrode group 14 through one electrode (as the second electrode 15b or 35b) of the second electrode group 15. As the number of the LED elements 13 in the first file 101 is the same as the number of the LED elements 13 in the fourth file 104, the LED elements 13 included in the first file 101 and the LED elements 13 included in the fourth file 104 are a light-emitting block to be lighted together.

The first file 101 and the fourth file 104 are arranged side by side at a central portion that extends from the first end 12a of to the second end 12b of the mounting area 12.

As the LED elements 13 included in the second file 102 and the LED elements 13 included in the third file 103 are electrically connected in series to each other and to the two electrodes (as the first electrode 14a and the second electrode 14b FIGS. 1, 2, 5, 6, 9, 10, 11, 12 or as the first electrode 34a and the second electrode 34b in FIGS. 13, 14) of the first electrode group 14 through one electrode (as the first electrode 15a or 35a) of the second electrode group 15, the LED elements 13 included in the second file 102 and the third file 103 are a light-emitting block to be lighted together. The number of the LED elements 13 included in the second file 102 that is positioned adjacent to a third end 12c of the mounting area 12 at a right side of the first file 101 is the same as the number of the LED elements 13 included in the third file 103 that is positioned adjacent to a fourth end 12d of the mounting area 12 at a left side of the first file 101, and the number of the LED elements 13 included in the first file 101 positioned at the central portion of the mounting area 12 is more than the number of the LED elements 13 included in the third file 103.

Figure 6:
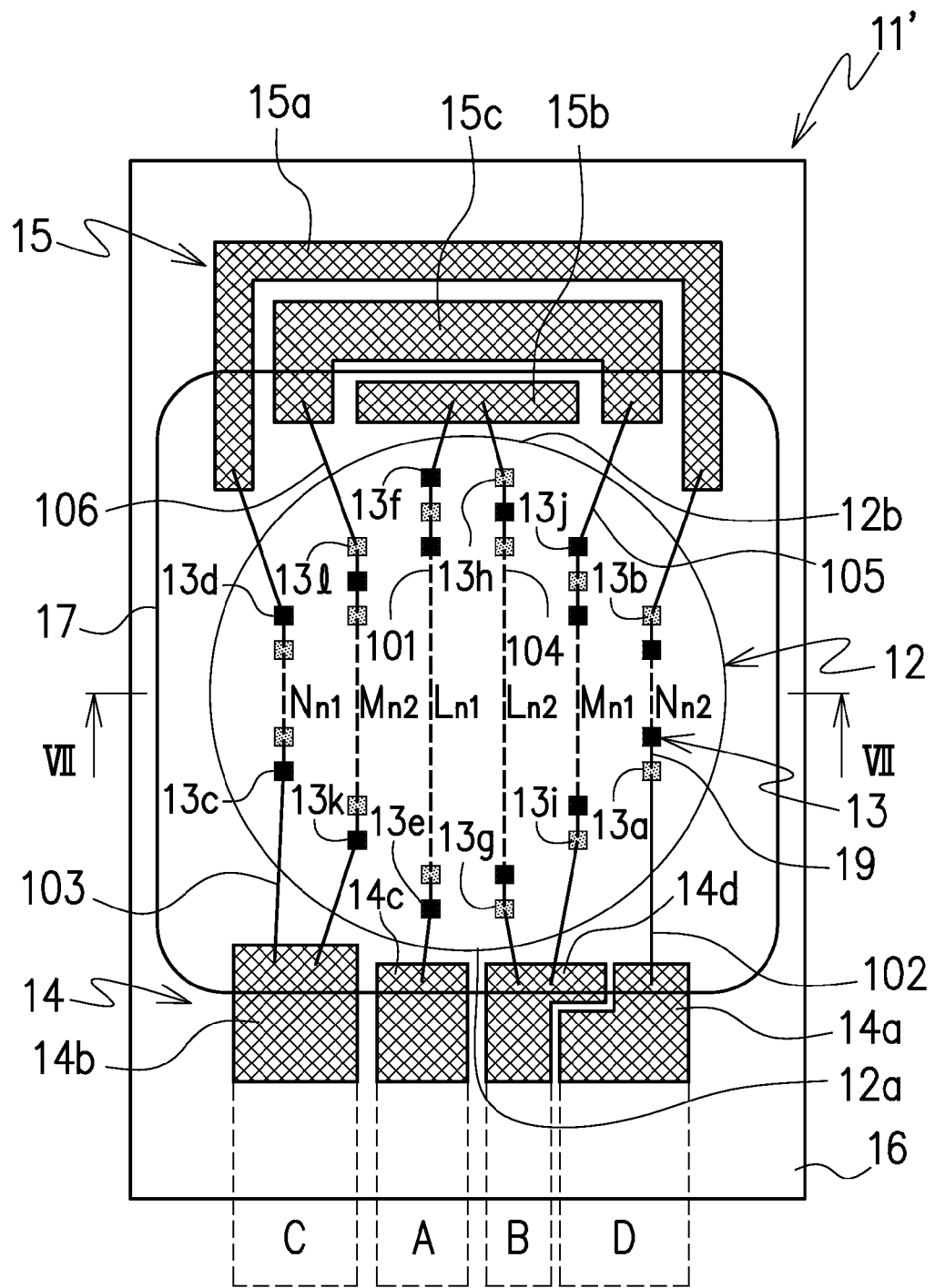
FIG. 6 is a plan view showing a light-emitting device according to a second embodiment of the present invention.
Figure 7:
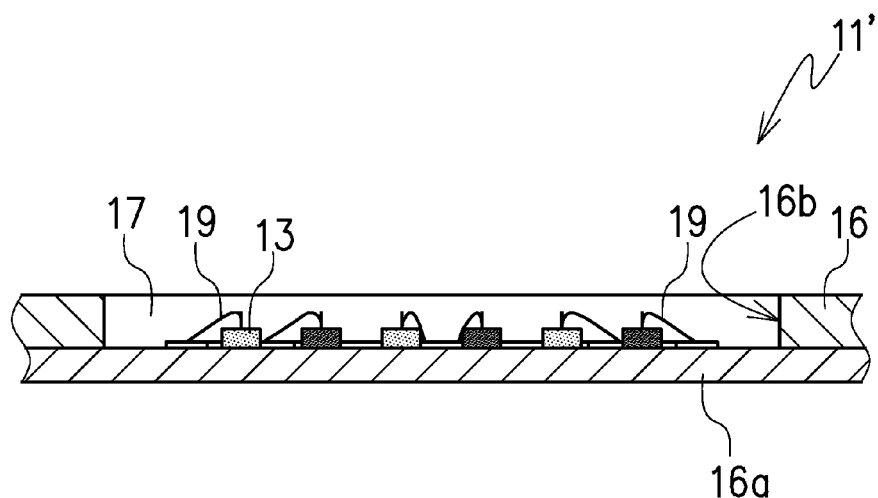
FIG. 7 is a sectional view taken along line VII-VII of the light-emitting device shown in FIG. 6.

FIGS. 6 and 7 show a second embodiment of a light-emitting device 11' according to the present invention. The light-emitting device 11' includes a metal plate 16a provided at the mounting area 12 on which the LED elements 13 are mounted. The LED elements 13 of the files that include the first file 101, the second file 102, and the third file 103 are provided on an upper surface of the metal plate 16a. Heat generated from the LED elements 13 can be effectively released through the metal plate 16a to outside of the light-emitting device 11'. An insulative substrate 16 including the first electrode group 14 and the second electrode group 15 may be disposed on the upper surface of the metal plate 16a. In this case, the insulative substrate 16 includes a through hole 16b that passes through an upper surface to a lower surface of the insulative substrate 16 and demarcates the mounting area 12 that is an upper surface of the metal plate 16a where the LED elements 13 are disposed.

The light-emitting device 11' in the second embodiment includes the metal plate 16a, the plurality of LED elements 13 arranged on the metal plate 16a, the first electrode group 14 as a power-feeding electrode group provided on an upper surface of the substrate 16 adjacent to the first end 12a of the mounting area 12, demarcated by the through-hole 16b of the substrate 16 and the second electrode group 15 as a transit electrode group provided on the upper surface of the substrate 16 adjacent to the second end 12b of the mounting area 12. If a light-transmitting resin 17 is disposed to seal the LED elements 13 and metallic wires 19 that electrically connect the LED elements 13 to electrodes of the first electrode group 14 and the second electrode group 15 light from the LED elements 13 in the files emitted through the light-transmitting resin 17. The light-transmitting resin 17 may be provided by a frame disposed around the mounting area 12, for example. The light-transmitting resin 17 may be formed in a circular shape, an elliptical shape, an approximately square shape, an elongated shape, and so on, filled in a frame of a desired shape. In the case of this configuration, the light-emitting area from the sealing resin 17 of the light-emitting device 11' has a size similar to or slightly larger than the mounting area 12 of the LED elements 13. Here, the electrodes of the first electrode group 14 may be an entry and/or an exit of an electrical current that is configured to be applied by an exterior connector, as the power feeding electrode group. The electrodes of the second electrode group 15 are transit electrodes through that the electrical current flows from the electrodes of the first electrode group 14 to the electrodes of the second electrode group. The electrodes of the second electrode group as the transit electrodes fulfill a role of relay to return an electrical current to the first electrode group 14 again.

The metal plate 16a here may be formed in an elliptic shape by aluminum, copper or other metallic plates having a high heat conductivity.

FIGS. 6 to 10 illustrate a second embodiment of a light-emitting device according to the present invention.

The light-emitting device 11' in the second embodiment differs from the first embodiment in that the light-emitting device 11 according to the second embodiment further includes a fifth file 105 and a sixth file 106. In this embodiment, the mounting area 12 includes a circular shape. The metal plate 16a here may be formed in a circular shape or just a rectangular shape.

The fifth file 105 includes a plurality of LED elements 13 are arranged to extend from the vicinity of the first end 12a of the mounting area 12 to the vicinity of the second end 12b of the mounting area 12 and electrically connected in series with each other of the LED elements 13 of the fifth file 105, and a sixth file 106 includes a plurality of LED elements 13 that are arranged to extend from the vicinity of the first end 12a of the mounting area 12 to the vicinity of the second end 12b of the mounting area 12 and electrically connected in series with each other of the LED elements 13 of the sixth file 106.

For more details, a first LED element 13i of the plurality of LED elements 13 included in the fifth file 105 and positioned adjacent to the first end 12a of the mounting area 12 is electrically connected in series by a metallic wire to the fourth electrode 14d of the first electrode group 14, and a second LED element 13j of the plurality of LED elements 13 included in the fifth file 105 and positioned adjacent to the second end 12b of the mounting area 12 is electrically connected in series by a metallic wire to the third electrode 15c of the second electrode group 15.

There are one or more LED elements 13 lined up between the first LED element 13i and the second LED element 13j of the fifth file 105 to be the fifth file 105. In the fifth file 105, the LED elements 13 each with a pair of element electrodes are electrically connected in series by metallic wires to neighboring LED elements 13 in the fifth file 105, the first LED element 13i is electrically connected in series by the metallic wire to the fourth electrode 14d of the first electrode group 14, and the second LED element 13j is electrically connected in series by the metallic wire to the third electrode 15b of the second electrode group 15.

The fifth file 105 is positioned between the fourth file 104 and the second file 102. The number of the LED elements 13 included in the fifth file 105 is fewer than the number of the LED elements 13 included in the fourth file 104 but is more than the number of the LED elements 13 included in the second file 102.

Furthermore, a first LED element 13k of the plurality of LED elements 13 included in the sixth file 106 and positioned adjacent to the first end 12a of the mounting area 12 is electrically connected in series by a metallic wire to the second electrode 14b of the first electrode group 14, and a second LED element 13l of the plurality of LED elements 13 included in the sixth file 106 and positioned adjacent to the second end 12b of the mounting area 12 is electrically connected in series by a metallic wire to the third electrode 15c of the second electrode group 15.

There are one or more LED elements 13 lined up between the first LED element 13k and the second LED element 13l of the sixth file 106 to be the sixth file 106. In the sixth file 106, the LED elements 13 each with a pair of element electrodes are electrically connected in series by metallic wires to neighboring LED elements 13 in the sixth file 106, the first LED element 13k is electrically connected in series by a metallic wire to the second electrode 14b of the first electrode group 14, and the second LED element 13d is electrically connected in series by a metallic wire to the first electrode 15a of the second electrode group 15.

The sixth file 106 is positioned between the first file 101 and the third file 103, and the number of the LED elements 13 included in the sixth file 106 is fewer than the number of the LED elements 13 included in the first file 101 but is more than the number of the LED elements 13 included in the third file 103.

There are six files of the first file 101 (Ln1), the fourth file 104 (Ln2), the fifth file 105 (Mn1), the sixth file 106 (Mn2), the third file 103 (Nn1), and the second file 102 (Nn2), and the plurality of LED elements 13 included in the first file 101, the fourth file 104, the fifth file 105, the sixth file 106, the third file 103 and the second file 105 that are arranged in parallel in the mounting area 12 are mounted on the upper surface of the metal plate 16a (see FIG. 6). The upper surface of the metal plate 16a can reflect light emitted from the plurality of LED elements 13. To enhance a reflection effect of the metal plate 16a, it is possible to process a surface of the metal plate 16a into a mirror surface or to coat the upper surface of the metal plate 16a by a light-reflecting material such as silver.

It is also possible that the LED elements 13 may be disposed directly on an upper surface of the insulative substrate 16, because there is a highly heat-conductive substrate such as a ceramic substrate. In this case, a substrate without a metal plate may be used.

The first electrode group 14 is positioned adjacent to the first end 12a of the mounting area 12 and the second electrode group 15 is—positioned adjacent to the second end 12b of the mounting area 12 (see FIG. 6). In the second embodiment, the first electrode group 14 is provided with the four independent electrodes as the first electrode 14a, the second electrode 14b, the third electrode 14c, and the fourth electrode 14d that can be an entry and/or an exit of an electrical current that is configured to be applied by terminals outside of the light-emitting device. The second electrode group 15 includes the first electrode 15a, the second electrode 15b, and the third electrode 15c that are independent electrodes and used as transit electrodes (see FIG. 6).

Here, the terminals outside are shown as a C terminal that applies an electrical current to the second electrode 14b, an A terminal that applies an electrical current to the third electrode 14c, a B terminal that applies an electrical current to the fourth electrode 14d, and a D terminal that applies an electrical current to the first electrode 14a in order from a left side to a right side of FIG. 6 (hereinafter referred to as A terminal to D terminal). A combination of a source voltage applied to some of the terminals A-B is configured to include three modes as the combination of the A terminal and the B terminal, the combination of the B terminal and the C terminal, and the combination of the C terminal and the D terminal, and in each combination, one terminal can be a positive pole and another can be a negative pole, or the one terminal can be a negative pole and the another can be a positive pole, alternatively.

Meanwhile, the A terminal, the B terminal, the C terminal and the D terminal can be exterior electrodes and/or terminals through which an electrical current is applied to electrodes of the first electrode group. The exterior electrodes configured to be the A to D terminals may be electrodes provided on a mother board of an electronic device or may be terminals of a lighting device, and so on. These terminals are illustrated by dotted lines in FIG. 6 because they are exterior electrodes and/or terminals but are configured to be electrically connected to the light-emitting device 11' through the electrodes of the first electrode group 14.

Figure 8:
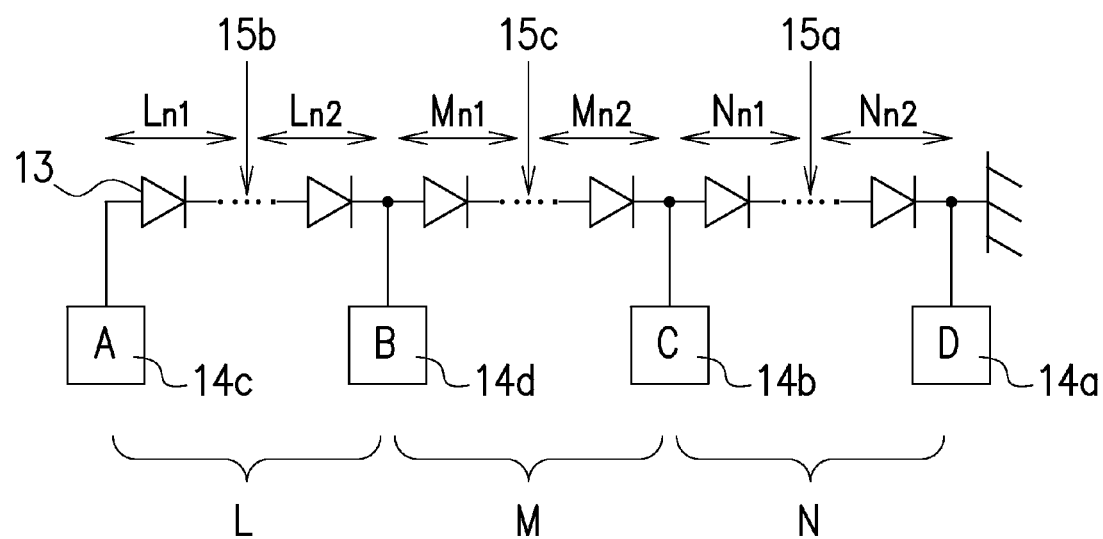
FIG. 8 is a view showing an equivalent circuit of the light-emitting device shown in FIG. 6.

FIG. 8 illustrates a connection equivalent circuit of the LED elements 13 in the light-emitting device 11' shown in FIG. 6.

As shown in FIG. 8, the plurality of LED elements 13 of the first file 101 (Ln1) and the fourth file 104 (Ln2) are electrically connected in series to the third electrode 14c and the fourth electrode 14d of the first electrode group 14 (between the A terminal and the B terminal), the plurality of LED elements 13 of the second file 102 (Nn2) and the third file 103

(Nn1) are electrically connected in series to the first electrode 14a and the second electrode 14b of the first electrode group 14 (between the D terminal and the C terminal). The number n of the LED elements 13 in each file may be several dozen, the proportion of the number of the LED elements 13 may have a relationship of L (Ln1+Ln2)>M (Mn1+Mn2)>N (Nn1+Nn2). In addition, emission color of the plurality of LED elements 13 included in each file can be selected, for example, red, green, blue, and yellow lights or a combination of LED element and phosphor. The LED elements 13 may be blue LED elements with a phosphor for a white light. As shown in FIGS. 6 and 7, each file forms a linear light-emitting area in that the LED elements 13 are electrically connected in series to each other by the metallic wires 19.

Figure 9:
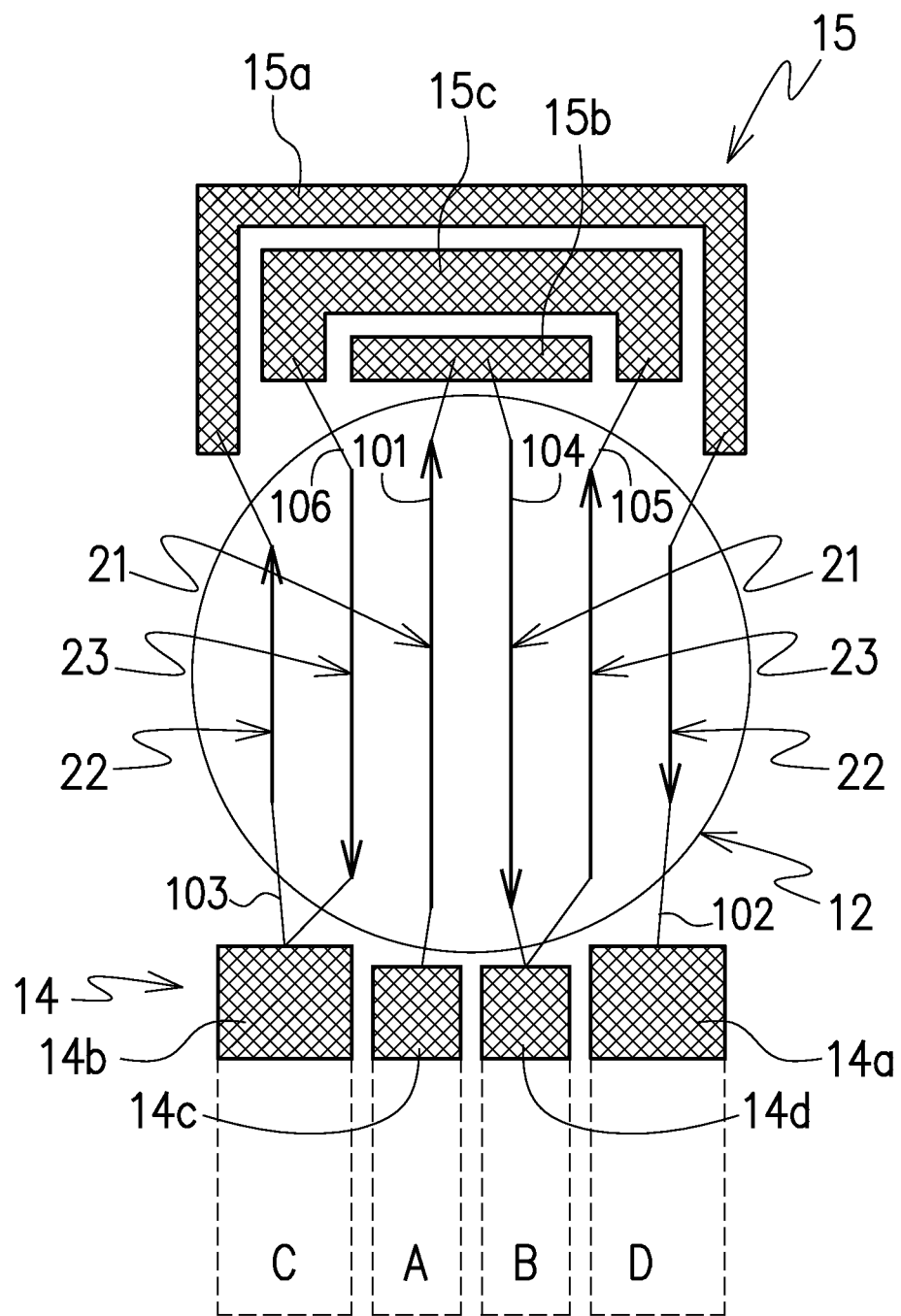
FIG. 9 is a plan view showing an electric connection condition of the light-emitting device shown in FIG. 6.

The linear light-emitting block is a first light-emitting block 21 that are a pair of central light-emitting files as a forth file 104 and a first file 101, a second light-emitting block 22 that are a pair of light-emitting files as a second file 102 adjacent to the third end 12c (right-side end as shown in FIG. 9) of the mounting area 12 and a third file 103 adjacent to the fourth end 12d (left-side end as shown in FIG. 9) of the mounting are 12.

Figure 10:
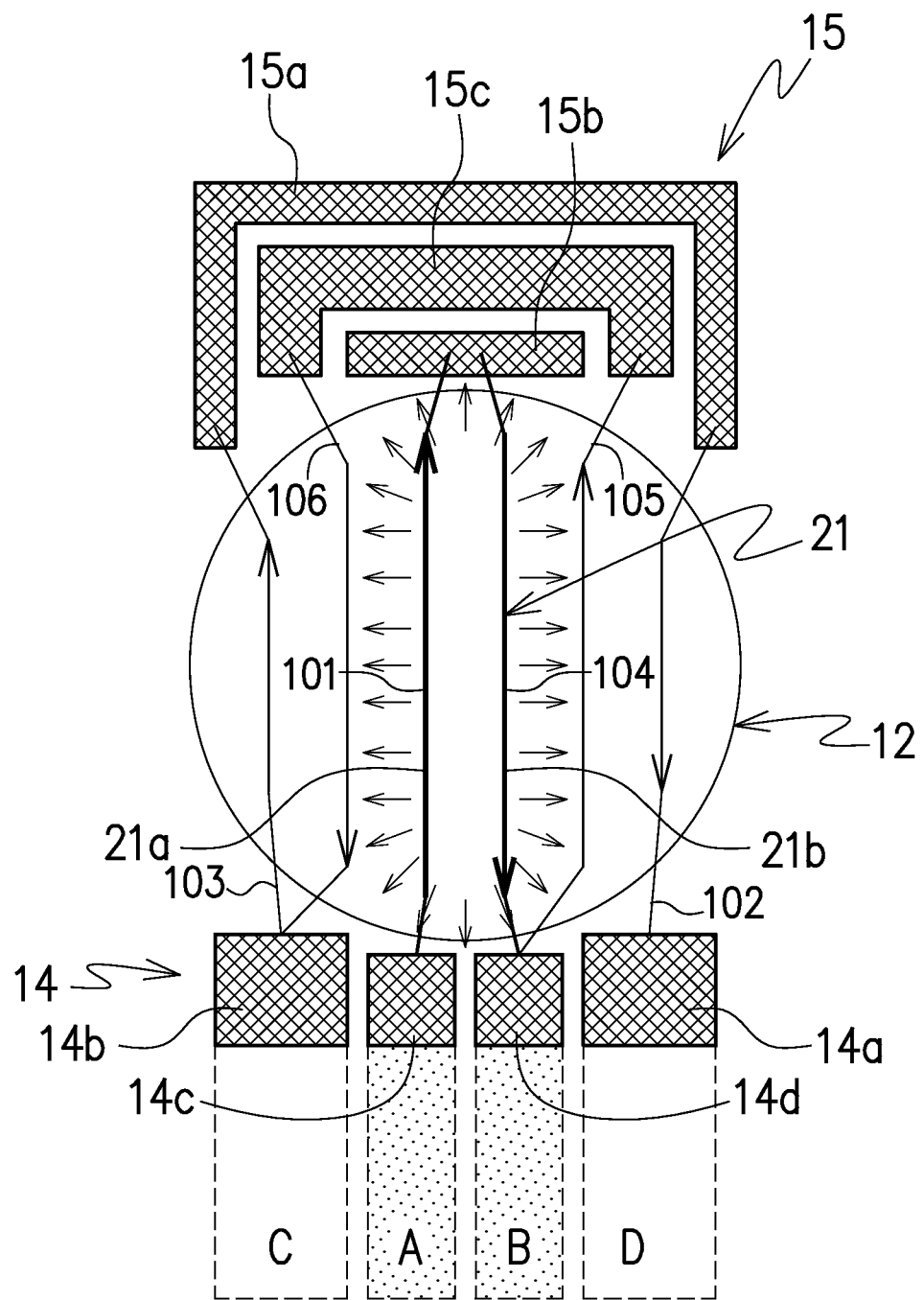
FIG. 10 is an explanatory view showing an example of a light-emitting pattern of the second light-emitting block.
Figure 11:
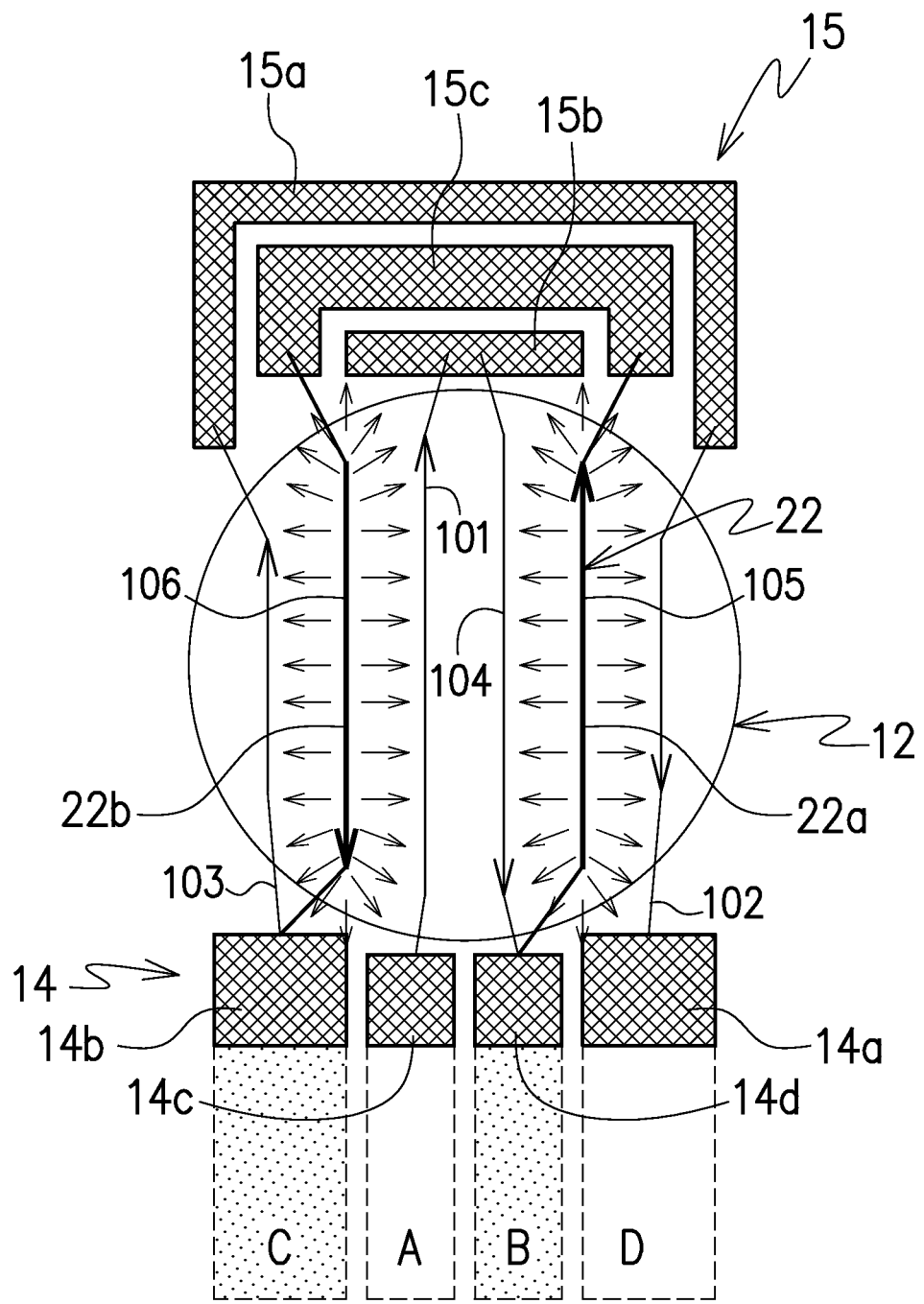
FIG. 11 is an explanatory view showing an example of a light-emitting pattern of a third light-emitting block.
Figure 12:
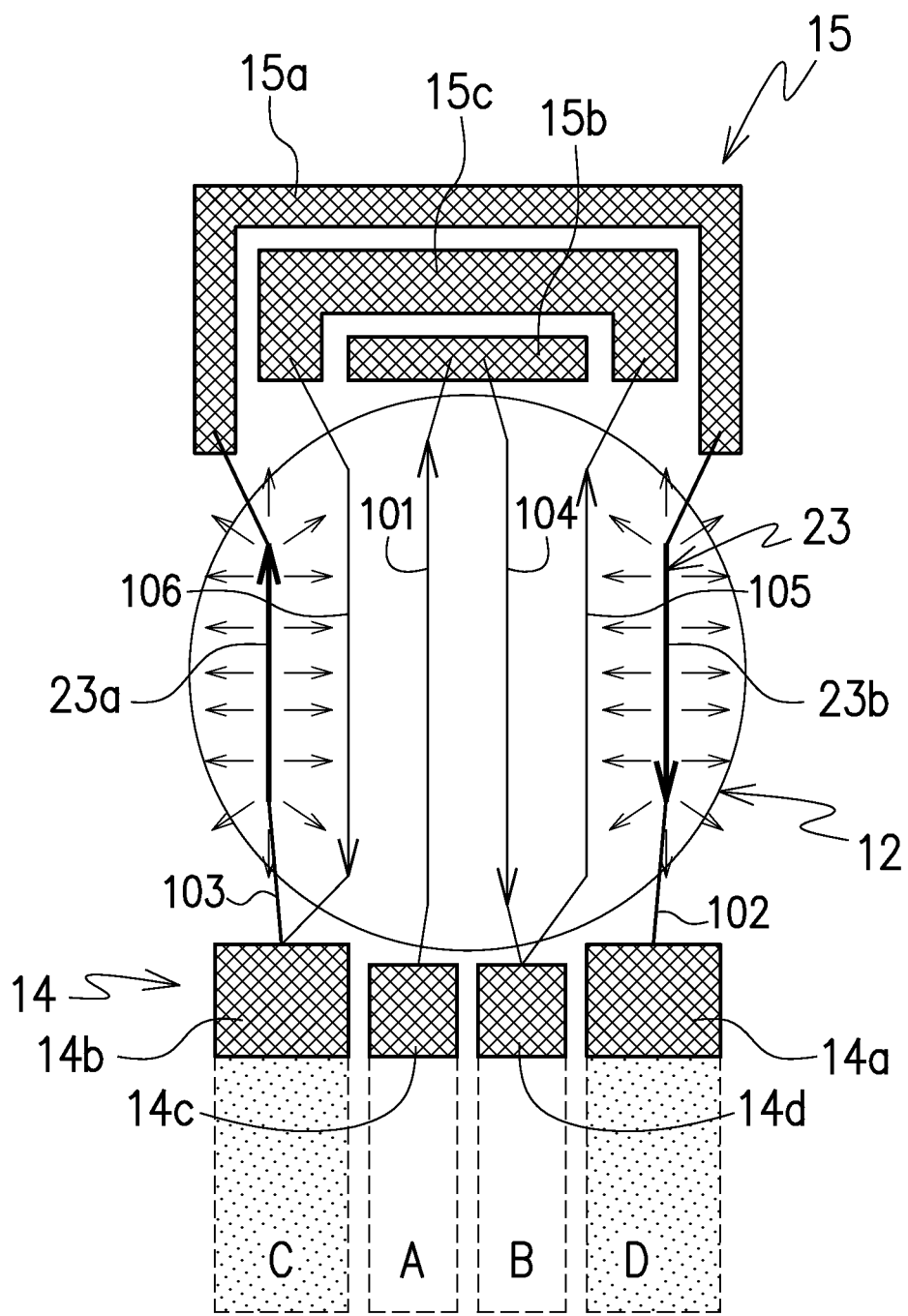
FIG. 12 is an explanatory view showing an example of a light-emitting pattern of a first light-emitting block.

FIGS. 10 to 12 illustrate an example of a light-emitting pattern of each of the first light-emitting block 21, the second light-emitting block 22 and the third light-emitting block 23.

First, the first light-emitting block 21 includes a first file 101 and a forth file 104. The LED elements 13 are not shown, but a first LED element included in the first file 101 adjacent to the first end 12a of the mounting area 12 is electrically connected the third electrode 14c (that is configured to be connected to the A terminal) of the first electrode group 14 and a second LED element included in the first file adjacent to the second end 12b of the mounting area 12 is electrically connected to the second electrode 15b of the second electrode group 15. Similarly, a first LED element in the fourth file 104 is electrically connected to the fourth electrode 14d (that is configured to be connected to the B terminal) of the first electrode group 14.

Accordingly, the LED elements 13 included in the first file 101, the LED elements 13 included in the fourth file 104 may be a light-emitting block to be lighted together when a voltage is applied to the third electrode 14c by the A terminal or to the fourth electrode 14d by the B terminal.

More specifically, when a predetermined voltage is applied from the A terminal that is electrically connected to the third electrode 14c toward the B terminal that is electrically connected to the fourth electrode 14d, the LED elements 13 of the first file 101 and the LED elements 13 of the fourth file 104 are lighted together to be the first light-emitting block 21, because the LED elements 13 of the first file 101 and the fourth file 104 are electrically connected in series.

Next, the second light-emitting block 22 includes the fifth file 105 and the sixth file 106. The first LED element included in the fifth file 105 and positioned adjacent to the first end 12a of the mounting area 12 is electrically connected in series to the fourth electrode 14d (that is configured to be connected to the B terminal) of the first electrode group 14 and the second light-emitting element included in the fifth file and positioned adjacent to the second end 12b of the mounting area 12 is electrically connected in series to the third electrode 15c of the second electrode group 15. The first LED element included in the sixth file 106 and positioned adjacent to the first end 12a of the mounting area 12 is electrically connected to the second electrode 14b (that is configured to be connected to the C terminal) of the first electrode group 14, and the second LED element included in the sixth file 106 and positioned adjacent to the second end 12b of the mounting area 12 is electrically connected to the first electrode 15a of the second electrode group 15.

The LED elements 13 included in the fifth file 105, and the LED elements 13 included in the sixth file 106 may be a light-emitting block to be lighted together.

More specifically, when a predetermined voltage is applied from the B terminal toward the C terminal, the LED elements 13 the fifth file 105 and the LED elements 13 of the sixth file 106 are connected in series, and therefore, the second light-emitting block 22 is lighted.

Finally, the third light-emitting block 23 includes a the second file 102 and the third file 103 having one end connected to the second electrode 14b (the C terminal) of the first electrode group 14 and another end extending to the first electrode 15a of the second electrode group 15, and a third back file 23b (the second file 102) having one end connected to the first electrode 15a of the second electrode group 15 and another end extending to the first electrode 14a (the D terminal) of the first electrode group 14.

Also, the LED elements 13 included in the second file 102, the LED elements 13 included in the third file 103 may be a light-emitting block to be lighted together.

When a predetermined voltage is applied from the C terminal toward the D terminal, the LED elements 13 of the third file 103 and the LED elements 13 of the second file 102 are connected in series, and therefore, the third light-emitting block 23 is lighted.

Because the first to third light-emitting blocks 21, 22, and 23 are disposed on the circular mounting area 12, if intervals among the LED elements 13 in each file are constant, LED elements 13 consisting the first light-emitting block 21 extending from the first end 12a to the second end 12b through a central portion of the mounting area 12 have the largest number. The number of the LED elements 13 of the second light-emitting block 22 positioned at both outer sides of the first light-emitting block 21 and extending from the first end 12a to the second end 12b of the mounting area 12 is lesser than that of the first light-emitting block 21. In addition, the number of the LED elements 13 consisting the third light-emitting block 23 positioned at both outer sides of the second light-emitting block 22 and extending from the first end 12a to the second end 12b of the mounting area 12 is lesser than that of the second light-emitting block 22.

Consequently, it is possible to select a full lighting in which a voltage is applied to all of the first to third light-emitting blocks 21, 22, and 23, and a partial lighting in which brightness is reduced in a stepwise fashion by applying a voltage selectively to one or more of the first to third light-emitting blocks 21, 22, and 23.

As mentioned above, three sets of terminals including a set of the A terminal that applies an electrical current to the third electrode 14c and the B terminal that applies an electrical current to the fourth electrode 14d, a set of the B terminal that applies an electrical current to the fourth electrode 14d and the C terminal that applies an electrical current to the second electrode 14b, and a set of the C terminal that applies an electrical current to the second electrode 14b and the D terminal that applies an electrical current to the first electrode 14a are provided. It is possible to light the first light-emitting block 21, the second light-emitting block 22, and the third light-emitting block 23 independently by applying a source voltage to one of their terminal set, selectively.

Moreover, when a source voltage is applied to the A terminal including the third electrode 14c and the C terminal including the second electrode 14b, the first light-emitting block 21 and the second light-emitting block 22 are simultaneously lighted. Furthermore, when a source voltage is applied to the B terminal including the fourth electrode 14d and the D terminal including the first electrode 14a, the second light-emitting block 22 and the third light-emitting block 23 are simultaneously lighted. Thereby, it is possible to acquire a light-emitting effect in that brightness is reduced in a stepwise fashion. Meanwhile, when a source voltage is applied to the A terminal including the third electrode 14c and the D terminal including the first electrode 14a, all of the first light-emitting block 21, the second light-emitting block 22, and the third light-emitting block 23 are lighted.

Figure 13:
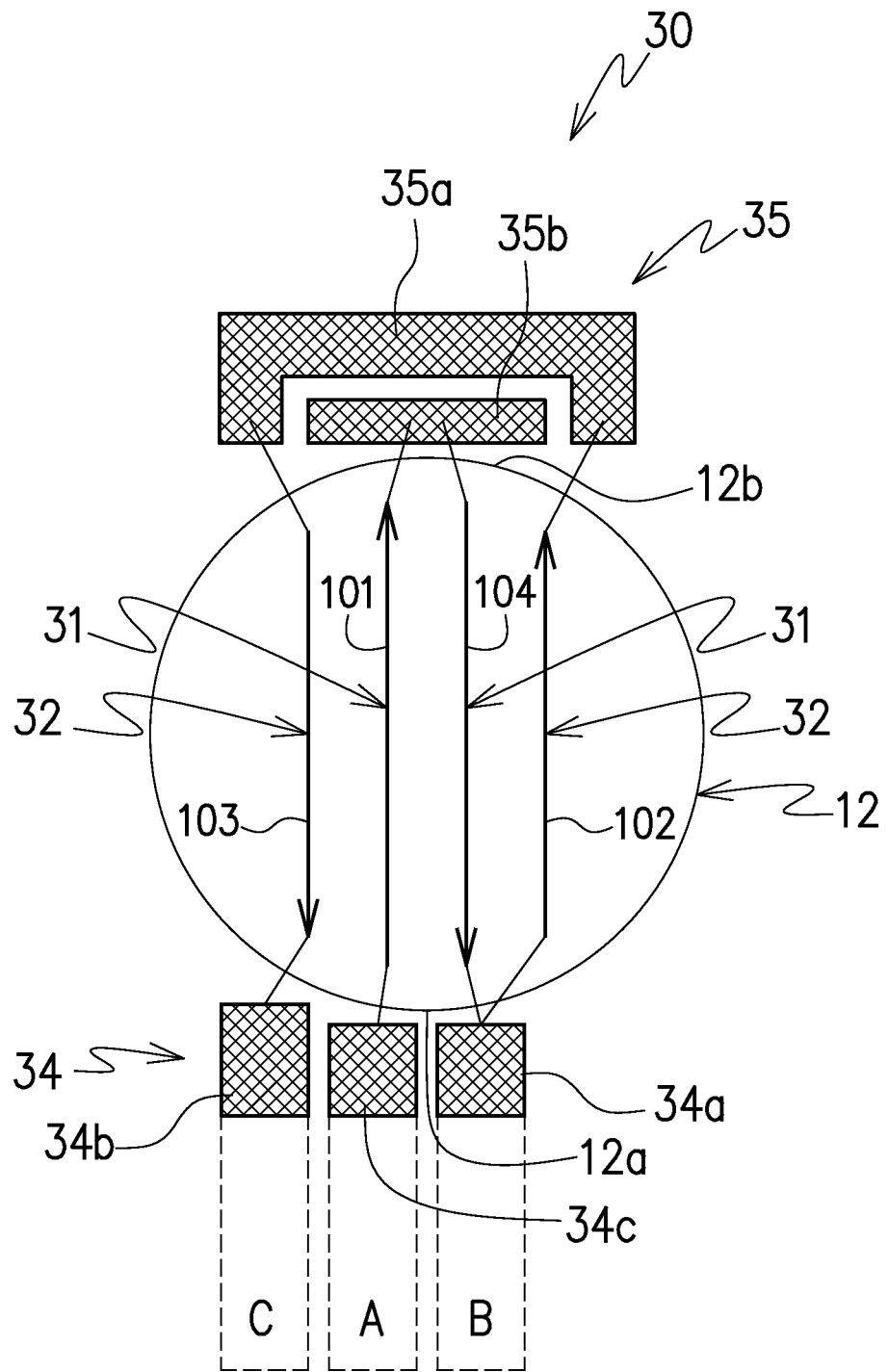
FIG. 13 is a plan view showing a first electric connection condition of a light-emitting device according to a third embodiment of the present invention.
Figure 14:
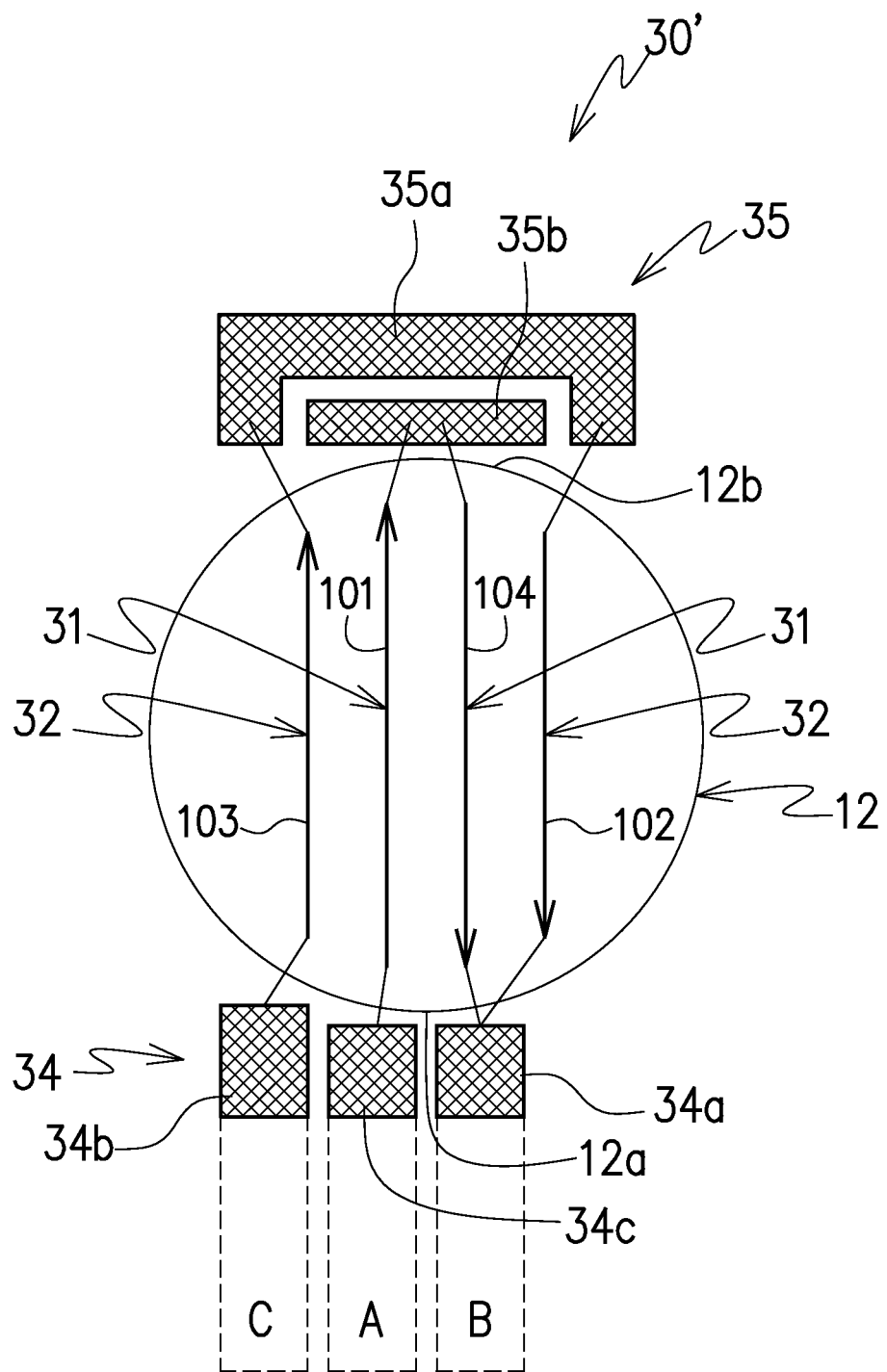
FIG. 14 is a plan view showing a second electric connection condition of a light-emitting device according to the third embodiment of the present invention.

FIG. 13 shows a first electric connection of a light-emitting device 30 according to a third embodiment of the present invention, and FIG. 14 shows a second electric connection of a light-emitting device 30' as a variation. The LED elements 13 are not shown in FIG. 13 and FIG. 14, but the LED elements are lined up in each of the first to fourth files in the light-emitting device 30 and 30' and electrically connected in series to the first electrode group 34 and to the second electrode group 35, as similar to the embodiments explained previously. In this embodiment, the first electrode group 34 includes the first electrode 34a, the second electrode 34b, and the third electrode 34c, and the second electrode group 35 includes a first electrode 35a and the second electrode 35b.

The light-emitting device 30 in the third embodiment includes the first file 101 being electrically connected in series to the third electrode 34c of the first electrode group 34 and the second electrode 35b of the second electrode group 35, the second file 102 disposed at a right side of the first file 101 being electrically connected in series to the first electrode 34a of the first electrode group 34 and the first electrode 35a of the second electrode group 35, a third file 103 disposed at a left side of the first file 101 being electrically connected in series to the second electrode 34b of the first electrode group 34 and the first electrode 35a of the second electrode group 35, and the fourth file 104 disposed at the right side of the first file 101 between the first file 101 and the second file 102 being electrically connected to the first electrode 34a of the first electrode group 34 and the second electrode 35b of the second electrode group 35.

With this structure, it is possible to perform a power feeding from each of three terminals of a B terminal through a first electrode 34a of a first electrode group 34, a C terminal through a second electrode 34b of the first electrode group 34, an A terminal through a third electrode 34c of the first electrode group 34, or a combination of the three terminals. It is the same as the light-emitting devices in the first and second embodiments to have the fact in that the first electrode group 34 is provided adjacent to the first end 12a of the mounting area 12 on which the LED elements are mounted, a second electrode group 35 is provided adjacent to the second end 12b of the mounting area 12 on which the LED elements are mounted, a voltage is not supplied from the second electrode group 35 which is a transit electrode group, and the transit electrode group fulfills a role of relay to return a current to the first electrode group 34 again.

It is possible to change files to be lighted up by a combination of the first electrode 34a, the second electrode 34b and the third electrode 34c of the first electrode group 34, and a first electrode 35a and a second electrode 35b of the second electrode group 35. In the third embodiment, it is possible to light the first light-emitting block 31 and the second light-emitting block 32 independently by a combination of two pairs of the first electrode 34a and the second electrode 34b of the first electrode group 34, and the first electrode 34a and the third electrode 34c of the first electrode group 34. In addition, when a source voltage is applied to the third electrode 34c and the second electrode 34b, all of the first light-emitting block 31 and the second light-emitting block 32 are lighted.

FIG. 14 shows the second electric connection in that the first file 101 and the fourth file 104 positioned at a central portion of the mounting area 12 are configured to be a first light-emitting block 31 to be lighted together when the A terminal applies an electric current to the third electrode 34c of the first electrode group 34, and the second file 102 positioned at the right side of the fourth file 104 and the third file 103 positioned at the left side of the first file 101 are configured to be a second light-emitting block 32 to be lighted together when the C terminal applies an electric current to the second electrode 34b.

Figure 4:
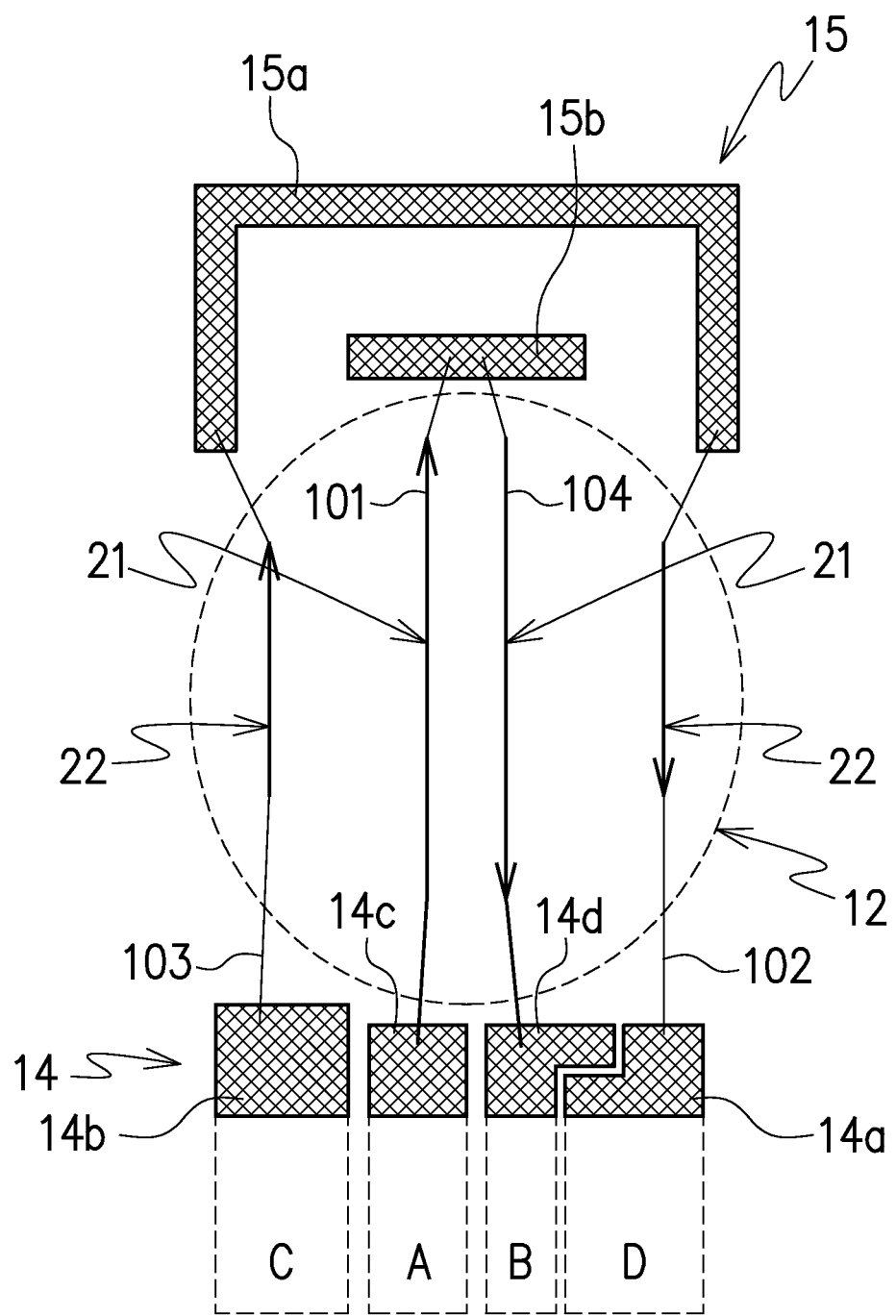
FIG. 4 is a plan view showing an electric connection condition of the light-emitting device shown in FIG. 1.
Figure 5:
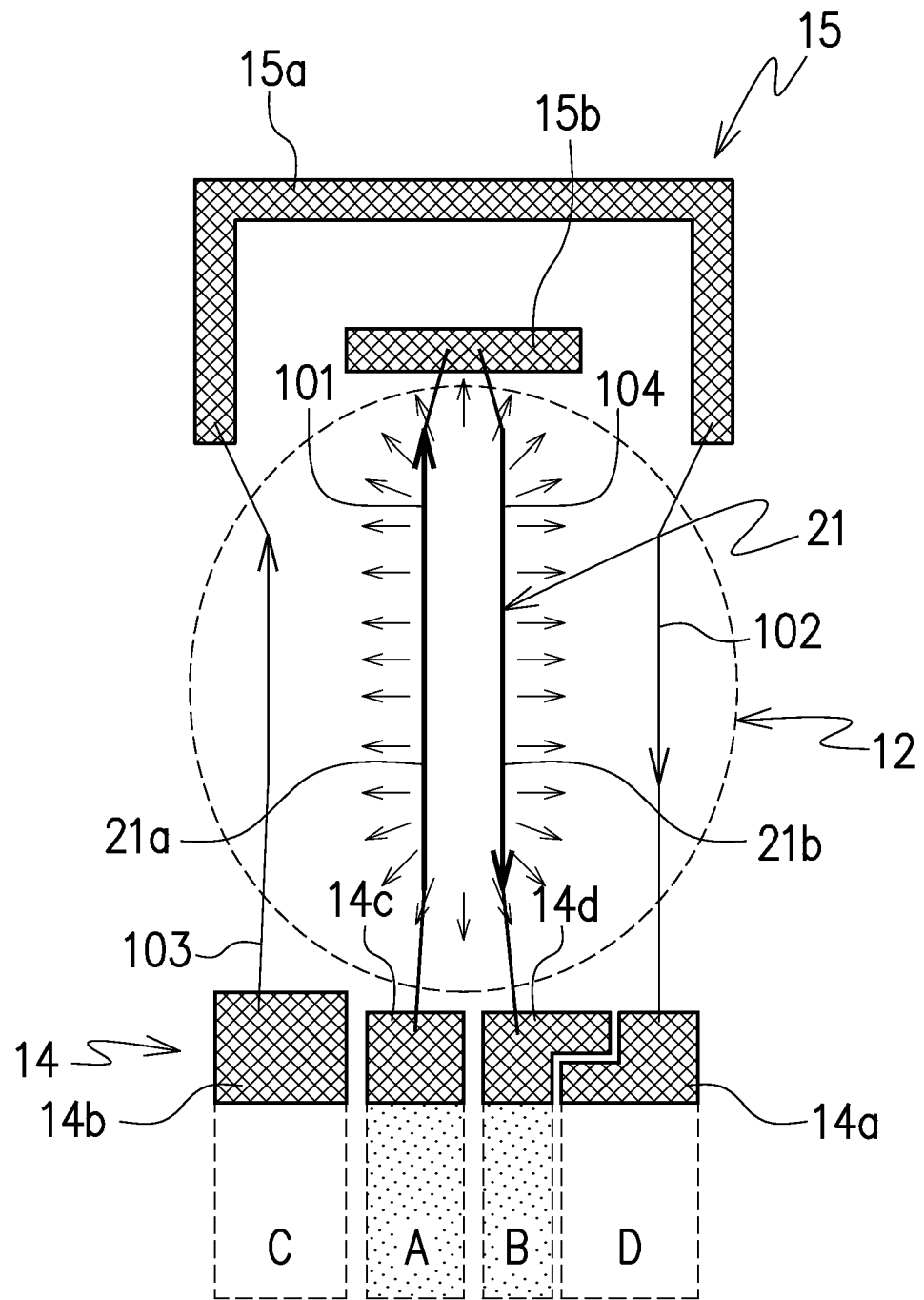
FIG. 5 is an explanatory view showing light emission of a second light-emitting block of the light-emitting device shown in FIG. 1.

Accordingly, the first light-emitting block 31 and the second light-emitting block 32 can be lighted separately as shown in FIG. 4 but in this embodiment, the number of the electrodes included in the first electrode group can be decreased to three from four of FIG. 4. In addition, when the B terminal applies an electric current to the first electrode 34a, the second file 102 and the third file 103 through the first electrode 35a of the second electrode group 35 and the fourth file 104 and the first file 101 through the second electrode 35b of the second electrode group 35 can be lighted together, just same as the light-emitting device 30 shown in FIG. 13. With variation of electrical connection available, if red LED elements as the LED elements 13 are arranged in the first file 101 and the fourth file 104, and blue LED elements as the LED elements 13 are arranged in the second file 102 and the third file 103, it is possible to change the color of light-emission such as red-light emission, blue-light emission, and a combination of the red and blue-light emission.

Figure 15:
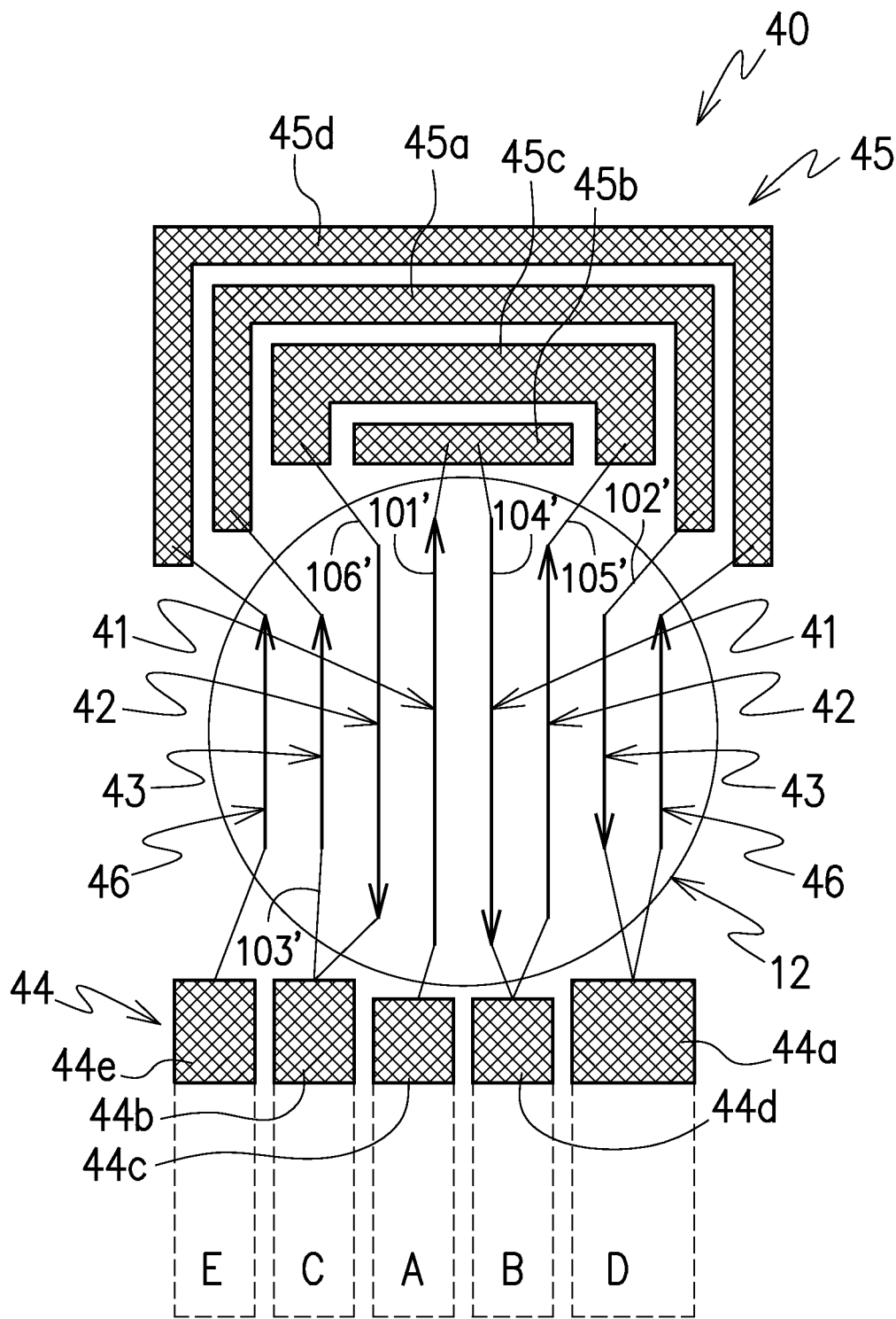
FIG. 15 is a plan view showing an electric connection condition of a light-emitting device according to a fourth embodiment of the present invention.

FIG. 15 illustrates a configuration of a light-emitting device 40 according to a fourth embodiment of the present invention.

The light-emitting device 40 in the fourth embodiment has a configuration in which a pair of fourth light-emitting block 46 are added to the light-emitting device 11' in the second embodiment, and configured to be capable of performing four-staged partial lightings. The fourth light-emitting block 46 are disposed in the mounting area 12 of the LED elements at both outsides of third light-emitting block 43 which are adjacent to the third end and the fourth end of the mounting area 12. In this configuration, a first electrode group 44 includes a first electrode 44a, a second electrode 44b, a third electrode 44c, a fourth electrode 44d, and a fifth electrode 44e. A second electrode group 45 as a transit electrode includes a first electrode 45a, a second electrode 45b, a third electrode 45c, and a fourth electrode 45d. It is possible to change a combination of files for lighting the files of the LED elements depending on a combination of the electrodes of the first electrode group 44 and the electrodes of the second electrode group 45.

In the fourth embodiment, it is possible to light the first light-emitting block 41 to the fourth light-emitting block 46 independently, by a combination of four electrode pairs of the first electrode group 44 of the third electrode 44c and the fourth electrode 44d, the fourth electrode 44d and the second electrode 44b, the second electrode 44b and the first electrode 44a, and the first electrode 44a and the fifth electrode 44e. In addition, when a source voltage is applied to the third electrode 44c and the fifth electrode 44e of the first electrode group 44, all the first light-emitting block 41 through the fourth light-emitting block 46 are lighted.

Figure 16:
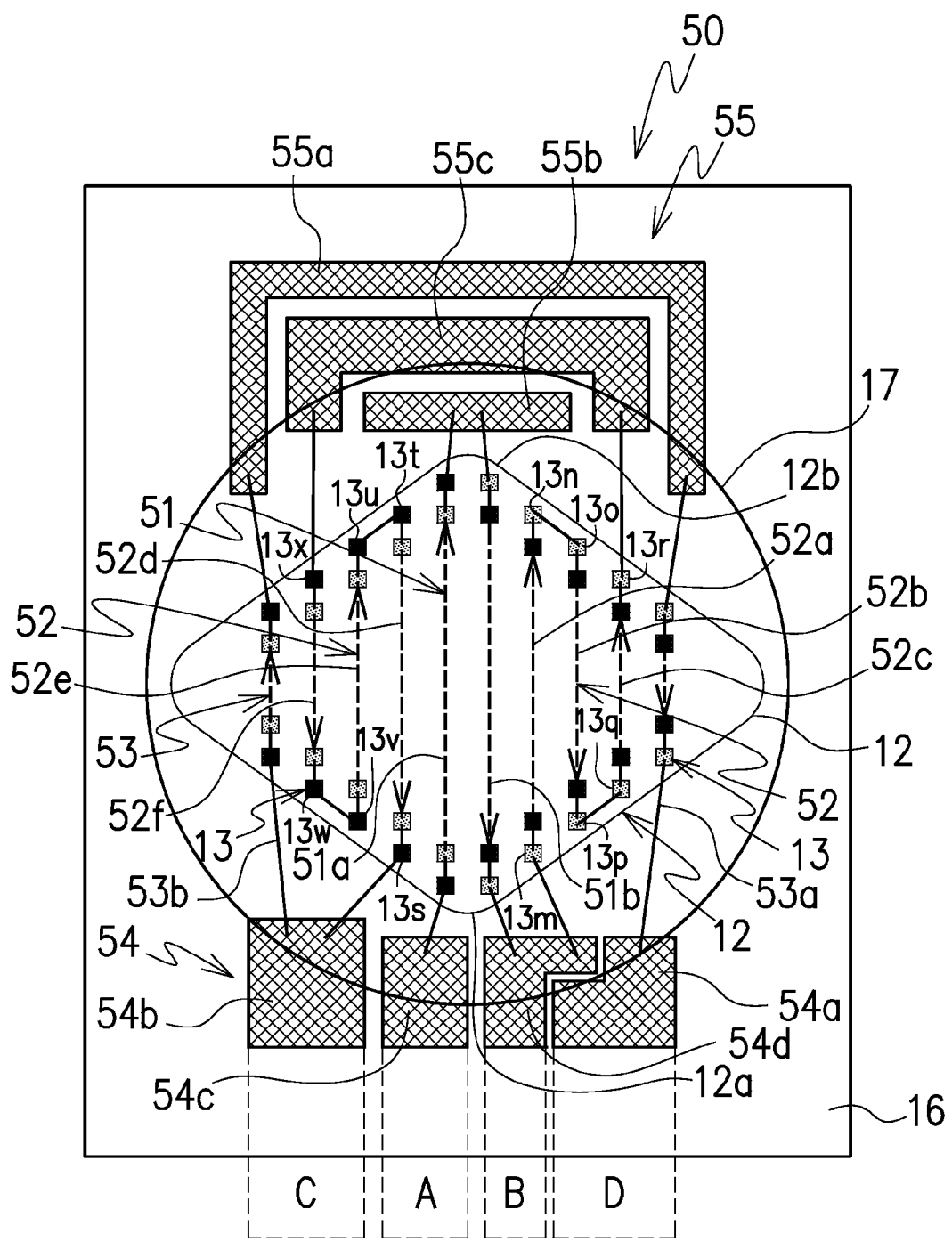
FIG. 16 is a plan view showing an electric connection condition of a light-emitting device according to a fifth embodiment of the present invention.

Next, a light-emitting device according to a fifth embodiment of the present invention and shown in FIG. 16 is described hereinafter.

The light-emitting device 50 according to the fifth embodiment of the present invention includes a first light-emitting block 51, a second light-emitting block 52, and a third light-emitting block 53. The first light-emitting block 51 includes a first file 51a, and a fourth file 51b in a central portion of the mounting area 12. A second file 53a is disposed at a right side of the first file 51a, and a third file 53b is disposed at a left side of the first file 51a to be the third light-emitting block 53. The second light-emitting block 52 further includes a fifth file 52a, a sixth file 52b, a seventh file 52c, an eighth file 52d, a ninth file 52e, and a tenth file 52f. In this embodiment, the mounting area 12 includes a rhombus shape with four vertices. The first end 12a of the mounting area 12 includes a first vertex of the four vertices, and the second end 12b of the mounting area 12 includes a second vertex opposite to the first vertex of the four vertices.

The light-emitting device 50 according to the fifth embodiment is configured to include the fifth file 52a disposed in parallel with the first file 51a at a right side of the first file 51a, the fifth file 52a in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the fifth file 52a by a metallic wire.

The light emitting device 50 is further configured to include the sixth file 52b disposed in parallel with the fifth file 52a at a right side of the fifth file 52a, the sixth file 52b in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the sixth file 52b by a metallic wire.

Also, the light-emitting device 50 is further configured to include the seventh file 52c disposed in parallel with the sixth file 52b at a right side of the sixth file 52b, the seventh file 52c in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the seventh file 52c by a metallic wire.

A first LED element 13m included in the fifth file 52a and positioned adjacent to the first end 12a of the mounting area 12 is electrically connected in series by a metallic wire to the fourth electrode 54d of the first electrode group 54, and a second LED element 13n included in the fifth file 52a and positioned adjacent to the second end 12b of the mounting area 12 is electrically connected in series to a first-LED element 13o that is included in the sixth file 52b and adjacent to the second side 12b of the mounting area 12.

Furthermore, a second LED element 13p included in the sixth file 52b and adjacent to the first side 12a of the mounting area 12 is electrically connected in series by a metallic wire to a first LED element 13q that is included in the seventh file 52c and adjacent to the first end 12a of the mounting area 12, and a second LED element 13r included in the seventh file 52c and adjacent to the second end 12b of the mounting area 12 is electrically connected in series to the third electrode 55c of the second electrode group 55.

In addition, the light-emitting device 50 may further includes a eighth file 52d disposed in parallel with the first file 51a at a left side of the first file 51a, the eighth file 52d in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the eighth file 52d by a metallic wire, and a ninth file 52e disposed in parallel with the eighth file 52d at a left side of the eighth file 52d, the ninth file 52e in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the ninth file 52e by a metallic wire.

A tenth file 52f is disposed in parallel with the ninth file 52e at a left side of the ninth file 52e, the tenth file 52f in that a plurality of light-emitting elements 13 are arranged in the mounting area 12 to extend from the vicinity of the first end 12a of the mounting area 12 to the vicinity of the second end 12b of the mounting area 12.

A first LED element 13s included in the eight file 52d and positioned adjacent to the first end 12a of the mounting area 12 is electrically connected in series to the second electrode 54b of the first electrode group 54, and a second LED element 13t included in the eighth file 52d and positioned adjacent to the second end 12b of the mounting area 12 is electrically connected in series by a metallic wire to a first LED element 13u that is included in the ninth file 52e and positioned adjacent to the second side 12b of the mounting area 12.

Also, a second LED element 13v included in the ninth file 52e and adjacent to the first side 12a of the mounting area 12 is electrically connected in series to a first LED element 13w that is included in the tenth file 52f and adjacent to the first end 12a of the mounting area 12, and a second LED element 13x included in the tenth file 52f and adjacent to the second end 12b of the mounting area 12 being electrically connected in series to the third electrode 55c of the second electrode group 55.

The LED elements 13 included in the fifth file 52a, the LED elements 13 included in the sixth file 52b, the LED elements 13 in the seventh file 52c, the LED elements 13 in the eighth file 52d, the LED elements 13 included in the ninth file 52e, and the LED elements 13 included in the tenth file 52f are electrically connected in series to the second electrode 54b of the first electrode group 54 and the fourth electrode 54d of the first electrode group 54 via the third electrode 55c of the second electrode group 55. Each of the LED elements 13 in a file is electrically connected in series by a metallic wire to another adjacent LED element 13 of the LED elements 13 in a file or in adjacent two or more files.

The LED elements 13 included in the fifth file 52a, the LED elements 13 included in the sixth file 52b, the LED elements 13 included in the seventh file 52c, the LED elements 13 included in the eighth file 52d, the LED elements 13 included in the ninth file 52e, the LED elements 13 included in the tenth file 53f, the LED elements 13 included in the second file 53a, and the LED elements 13 included in the third file 53b may be a light-emitting block to be lighted together.

The LED elements 13 included in the fifth file 52a, the LED elements 13 included in the sixth file 52b, the LED elements 13 included in the seventh file 52c, the LED elements 13 included in the eighth file 52d, the LED elements 13 included in the ninth file 52e, the LED elements 13 included in the tenth file 52f, the LED elements 13 included in the first file 51a, and the LED elements 13 included in the fourth file 51b may be a light-emitting block to be lighted together.

Next, a current supply of the light-emitting device 50 according to the fifth embodiment is described hereinafter.

In the light-emitting device 50 according to the fifth embodiment, the second light-emitting block 52 includes a path from the fourth electrode 54d of the first electrode group 54 toward the third electrode 55c of the second electrode group 55, and a path from the third electrode 55c of the second electrode group 55 toward the second electrode 54b of the first electrode group 54. Paths of three files composed of the fifth file 52a, the sixth file 52b, and the seventh file 52c are provided outside the first light-emitting block 51 including the first file 51a and the fourth file 51b, and paths of three files composed of the eighth file 52d, the ninth file 52e, and the tenth file 52f are provided at a left side of the first light-emitting block 51 including the first file 51a and the fourth file 51b.

The number of the LED elements 13 included in the fifth file 52a is more than that of the LED elements 13 included in the sixth file 52b. The number of the LED elements 13 included in the sixth file 52b is more than that of the LED elements 13 included in the seventh file 52c. That is to say, the LED elements 13 included in the file positioned at a central portion of the mounting area 12 have the largest number, and in files disposed outside right and left sides of the central file, the number of the LED elements 13 becomes less as going to the outside files.

Meanwhile, the first light-emitting block 51 includes the first file 51a in that a plurality of LED elements 13 are arranged in the mounting area 12 to extend from a vicinity of the first end 12a of the mounting area 12 to a vicinity of the second end 12b of the mounting area 12 and electrically connected in series with each other of the LED elements 13 of the first file 51a, and the fourth file 51b in that a plurality of LED elements 13 are arranged in the mounting area 12 to extend from the vicinity of the first end 12a of the mounting area 12 to the vicinity of the second end 12b of the mounting area 12 and electrically connected in series with each other of the light-emitting elements of the fourth file 51b. A first LED element of the LED elements 13 included in the first file 51a and positioned adjacent to the first end 12a of the mounting area 12 is electrically connected in series by a metallic wire to the third electrode 54c of the first electrode group 54, and a second LED element of the LED elements 13 included in the first file 51a and positioned adjacent to the second end 12b of the mounting area 12 is electrically connected in series by a metallic wire to the second electrode 55b of the second electrode group 55. In the fourth file 51b, a first LED of the LED elements 13 included in the fourth file 51b and positioned adjacent to the first end 12a of the mounting area 12 is electrically connected in series by a metallic wire to the fourth electrode 54d of the first electrode group 54, and a second LED element of the LED elements 13 included in the fourth file 51b and positioned adjacent to the second end 12b of the mounting area 12 is electrically connected in series by a metallic wire to the second electrode 55b of the second electrode group 55.

The second light-emitting block 52 is disposed outside the first light-emitting block 51, and the third light-emitting block 53 is disposed outside the second light-emitting block 52.

As mentioned above, the number of the LED elements 13 included in the second light-emitting block 52 disposed between the first light-emitting block 51 and the third light-emitting block 53 is more than that of the first light-emitting block 51 disposed at the central portion of the mounting area and the third light-emitting block 53 disposed outside the second light-emitting block 52, it is possible to acquire sufficient brightness only by selecting the second light-emitting block 52. In addition, a light-emitting area of the second light-emitting block 52 has a circular-shaped broadening.

Figure 17:
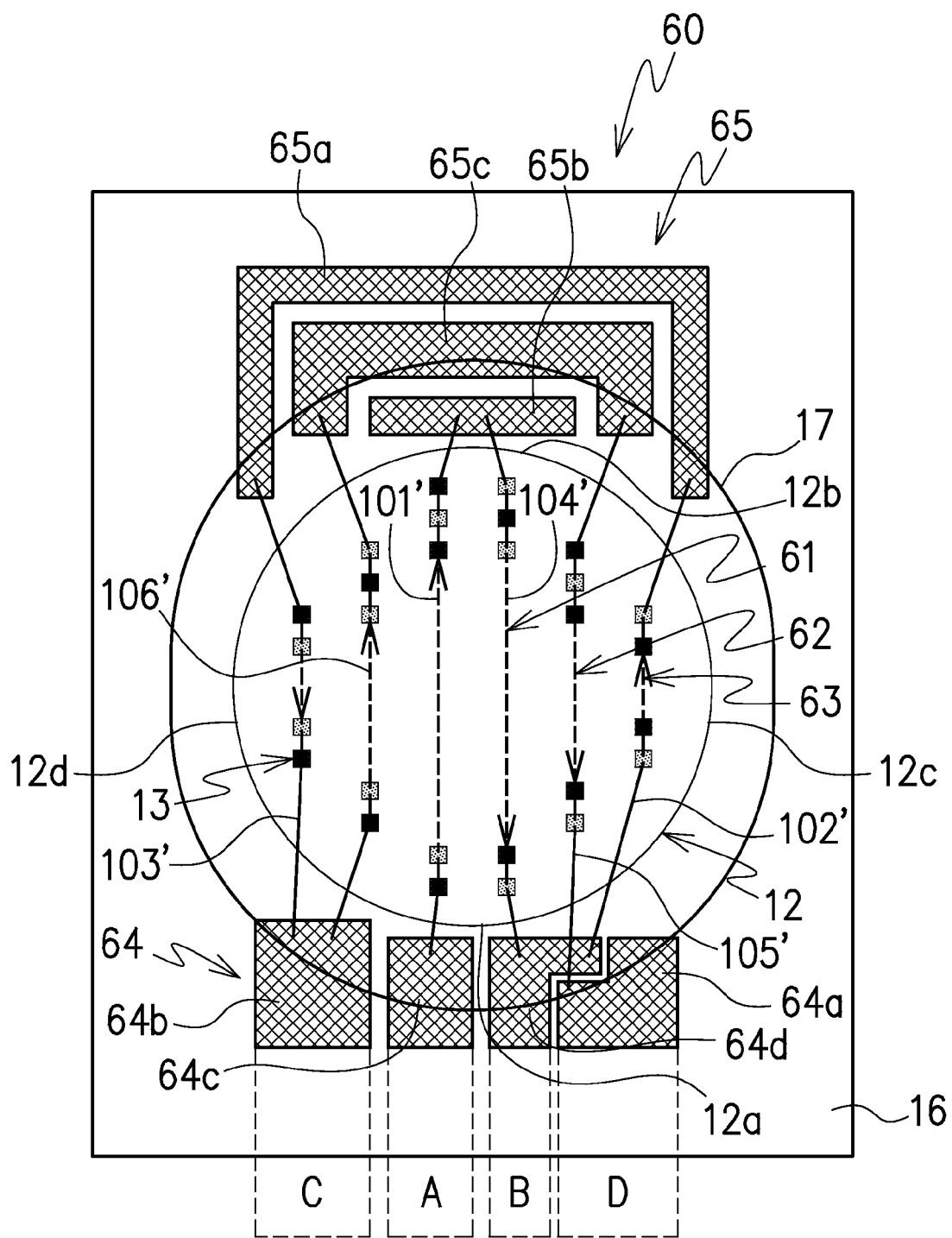
FIG. 17 is a plan view showing an electric connection condition of a light-emitting device according to a sixth embodiment of the present invention.

FIG. 17 illustrates a configuration of a light-emitting device 60 according to a sixth embodiment of the present invention.

The light-emitting device 60 in the sixth embodiment is the same as the light-emitting device 11' according to the second embodiment, as shown in FIG. 6 in the following points.

The light-emitting device 60 includes a mounting area 12 on which LED elements 13 are mounted and including a first end 12a and a second end 12b, a first electrode group 64 provided adjacent to the first end 12a of the mounting area 12, and a second electrode group 65 provided adjacent to the second end 12b of the mounting area 12.

The light-emitting device further includes a first file 101' provided to extend from a vicinity of the first end 12a of the mounting area 12 to a vicinity of the second end 12b of the mounting area 12 and including a plurality of LED elements 13 electrically connected in series with each other, a second file 102' disposed at a right side of the first file 101' in parallel with the first file 101', provided to extend from a vicinity of the first end 12a of the mounting area 12 to a vicinity of the second end 12b of the mounting area 12 and including a plurality of LED elements 13 electrically connected in series with each other, a third file 103' disposed at a left side of the first file 101' in parallel with the first file 101', provided to extend from a vicinity of the first end 12a of the mounting area 12 to a vicinity of the second end 12b of the mounting area 12 and including a plurality of LED elements 13 electrically connected in series with each other, a fourth file 104' disposed adjacent to a right side of the first file 101' in parallel with the first file 101', provided to extend from the vicinity of the first end 12a of the mounting area 12 to the vicinity of the second end 12b of the mounting area 12 and including a plurality of LED elements 13 electrically connected in series with each other, a fifth file 105' disposed at a right side of the first file 101' in parallel with the first file 101', provided to extend from a vicinity of the first end 12a of the mounting area 12 to a vicinity of the second end 12b of the mounting area 12 and including a plurality of LED elements 13 electrically connected in series with each other, and a sixth file 106' disposed at a left side of the first file 101' in parallel with the first file 101', provided to extend from a vicinity of the first end 12a of the mounting area 12 to a vicinity of the second end 12b of the mounting area 12 and including a plurality of LED elements 13 electrically connected in series with each other.

In addition, the arrangement of the electrodes of the first electrode group 64 and the electrodes of the second electrode group 65 is also the same as that of the first electrode group 14 and the second electrode group 15 of the light-emitting device 11' according to the second embodiment as shown in FIG. 6.

The sixth embodiment differs from the second embodiment in the following points.

In the second embodiment, the LED element 13 of the fifth file 105 disposed at a position close to the first end 12a of the mounting area 12 is electrically connected to the fourth electrode 14d of the first electrode group 14 through the metallic wire. In contrast, in the sixth embodiment, this LED element 13 is electrically connected to a first electrode 64a of the first electrode group 64 through a metallic wire. In addition, in the second embodiment, the LED element 13 of the second file 102 disposed at a position close to the first end 12a of the mounting area 12 is electrically connected to the first electrode 14a of the first electrode group 14 through the metallic wire. In contrast, in the sixth embodiment, this LED element 13 is electrically connected to a fourth electrode 64d of the first electrode group 64 through a metallic wire.

The light-emitting device 60 according to the sixth embodiment is configured to be capable of lighting in order a first light-emitting block 61 including the first file 101' positioned at a central portion of the circular mounting area 12 on which the LED elements 13 are mounted and the fourth file 104' positioned adjacent to the right side of the first file 101', a second light-emitting block 63 including the second file 102' disposed close to the third end 12c in a direction perpendicular to a virtual line combining the first end 12a and the second end 12 of the mounting area 12 and the third file 103' disposed close to the fourth end 12d opposite to the third end 12c, and a third light-emitting block 62 positioned between the first light-emitting block 61 and the second light-emitting block 63 and including the fifth file 105' and the sixth file 106', by exchanging an application of a source voltage in order in a combination of a third electrode 64c and a fourth electrode 64d of the first electrode group 64, the fourth electrode 64d and a second electrode 64b of the first electrode group 64, and the second electrode 64b and a first electrode 64a of the first electrode group 64.

In this way, the light-emitting device 60 according to the sixth embodiment has a different light-emitting pattern from that of the light-emitting devices 11, 11', 30, 40, and 50 according to the first to fourth embodiments.

Figure 18:
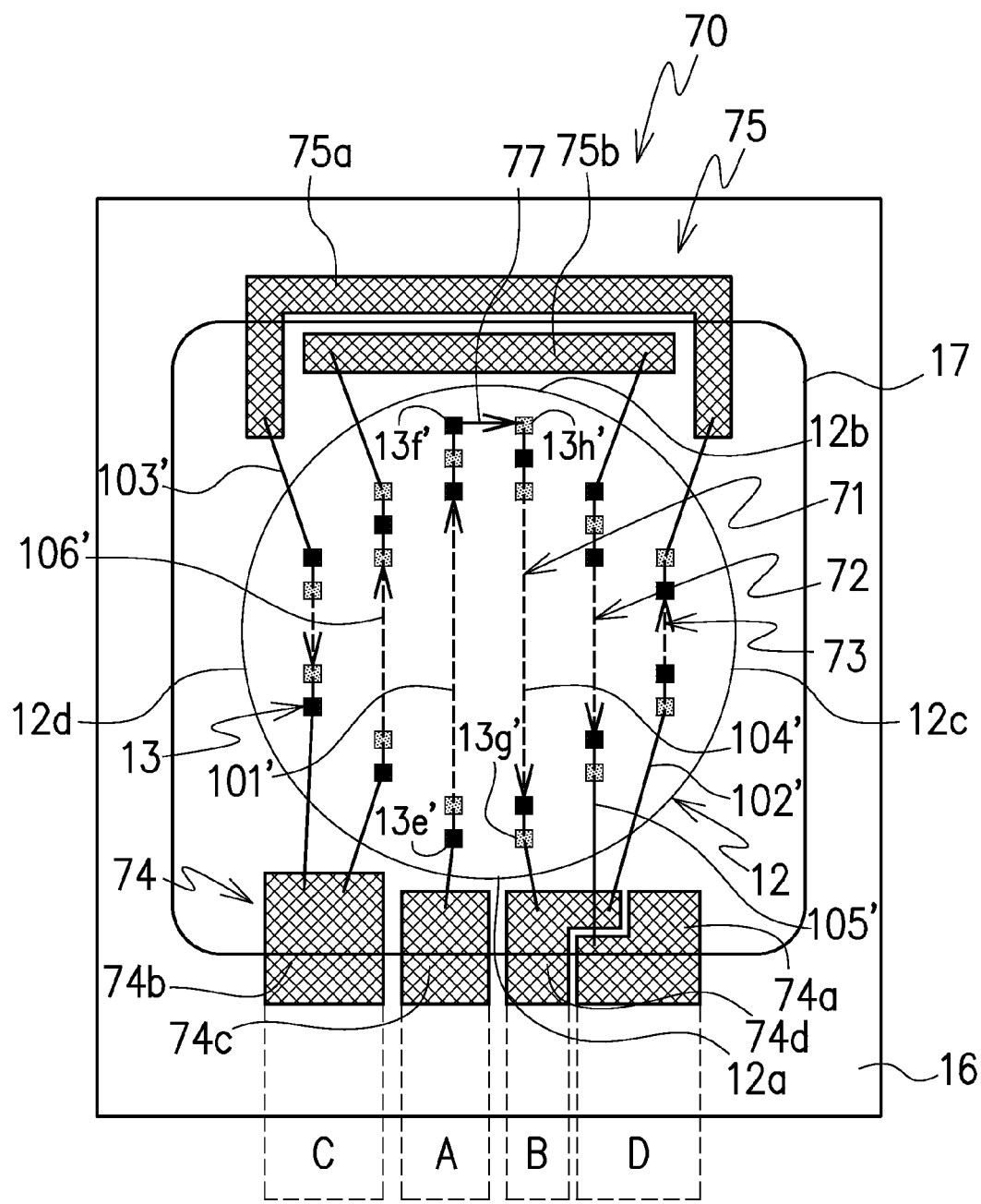
FIG. 18 is a plan view showing an electric connection condition of a light-emitting device according to a seventh embodiment of the present invention.

FIG. 18 illustrates a configuration of a light-emitting device 70 according to a seventh embodiment of the present invention.

The light-emitting device 70 includes a mounting area 12 that includes a first end 12a and a second end 12b opposite to the first end 12a, a first electrode group 74 adjacent to the first end 12a of the mounting area 12, a second electrode group 75 adjacent to the second end 12b of the mounting area 12, a first file 101' in that a plurality of LED elements 13 are arranged in the mounting area 12 to extend from a vicinity of the first end 12a of the mounting area 12 to a vicinity of the second end 12b of the mounting area 12 and electrically connected in series with each other of the LED elements 13 of the first file 101', a second file 102' disposed at a right side of the first file 101' in parallel with the first file 101', the second file 102' in that a plurality of LED elements 13 are arranged in the mounting area 12 to extend from the vicinity of the first end 12a of the mounting area 12 to the vicinity of the second end 12b of the mounting area 12 and electrically connected in series with each other of the LED elements 13 of the second file 102', a third file 103' disposed at a left side of the first file 101' in parallel with the first file 101', the third file 103' in that a plurality of LED elements 13 are arranged in the mounting area 12 to extend from the vicinity of the first end 12a of the mounting area 12 to the vicinity of the second end 12b of the mounting area 12 and electrically connected in series with each other of the LED elements 13 of the third file 103', and a fourth file 104' disposed in parallel with the first file 101' at a left side of the first file 101', the fourth file 104' in that a plurality of LED elements 13 are arranged in the mounting area 12 to extend from the vicinity of the first end 12a of the mounting area 12 to the vicinity of the second end 12b of the mounting area 12, and electrically connected in series with each other of the LED elements 13 of the fourth file 104'.

The first electrode group 74 further includes a third electrode 74c and a fourth electrode 74d.

The second electrode group 75 further includes a second electrode 75b. A first LED element 13e' of the LED elements 13 included in the first file 101' and positioned adjacent to the first end 12a of the mounting area 12 is electrically connected in series to the third electrode 74c of the first electrode group 74.

A first LED element 13g' of the LED elements 13 included in the fourth file 104' and positioned adjacent to the first end 12a of the mounting area 12 is electrically connected in series to the fourth electrode 74d of the first electrode group 74, and a second LED element 13f' included in the first file 101' and positioned adjacent to the second end 12b of the mounting area 12 is electrically connected in series to a second LED element 13h' included in the fourth file 104' and positioned adjacent to the second end 12b of the mounting area 12.

In one example, the mounting area 12 includes a circular shape, the first end 12a of the mounting area 12 includes a circular arc, and the second end 12b of the mounting area 12 includes a circular arc.

The mounting area 12 may be formed in an elliptic shape, the first end 12a of the mounting area 12 includes an elliptic arc, and the second end 12b of the mounting area 12 includes an elliptic arc.

The light-emitting device further includes a metal plate disposed at the mounting area 12. The LED elements of the files that include the first file, the second file, and the third file are disposed on an upper surface of the metal plate. The light-emitting device further includes a substrate disposed on the upper surface of the metal plate, and the first electrode group and the second electrode group are disposed on an upper surface of the substrate. The substrate includes a hole that demarcates the mounting area 12.

The light-emitting device 70 according to the seventh embodiment includes a first light-emitting block 71 disposed in a central portion of the mounting area 12 on which the LED elements 13 are mounted and a second light-emitting block 72 disposed outside the first light-emitting block 71, and a third light-emitting block 73 disposed outside the second light-emitting block 72. The first light-emitting block 71 includes a first file 101' and a fourth file 102'. An LED element 13 of the first file 101' disposed close to the first end 12a of the mounting area 12 is connected to the third electrode 74c and an LED element 13 of the fourth file 102' disposed close to the first end 12a of the mounting area 12 is connected to the fourth electrode 74d, without passing the first electrode 75a and the second electrode 75b of the second electrode group 75.

That is to say, the LED elements 13 included in each of the first file 101' and the fourth file 102' which are a pair of LED element files consisting the first light-emitting block 71, disposed close to the second end 12b of the mounting area 12 are connected to each other through a metallic wire 77. Thereby, the number of electrodes of the second electrode group 75 which is a transit electrode can be reduced, and the light-emitting device 70 can be miniaturized.

Meanwhile, in the aforementioned light-emitting device 70, the second light-emitting block 72 disposed at an intermediate position of the mounting area 12 is connected in series to the second electrode 74b and the first electrode 74a of the first electrode group 74 through the second electrode 75b of the second electrode group 75.

The third light-emitting block 73 disposed close to the third end 12c in a direction perpendicular to a virtual line combining the first end 12a and the second end 12b of the mounting area 12 and the fourth end 12d is connected in series to the fourth electrode 74d and the second electrode 74b of the first electrode group 74 through the first electrode 75a of the second electrode group 75.

As mentioned above, in the light-emitting device according to the each of the embodiments, basically, if the number of the electrodes of the first electrode group is n, the number of the electrodes of the second electrode group becomes n−1. In other words, the number of electrodes included in the first electrode group minus one equals the number of electrodes included in the second electrode group, because an electrical current by an exterior terminal can be applied to the electrodes of the first electrode group but the electrodes of the second electrode group are transit electrodes. It is possible to extend with a relationship of 2n−2 total number of files in which LED elements are connected in series, returned to the electrodes of the second electrode group through the files.

In addition, although individual LED elements in each file are arranged linearly in drawings, the LED elements may be arranged in a zigzag manner such that adjacent LED elements are alternated in right and left directions. The arrangement of LED elements in the zigzag manner makes it possible to extend a width of lighting in the right and left direction.

It is possible to use together different light-emitting characteristics such as light-emitting colors, brightness and so on, for LED elements consisting each file. In addition, the LED elements can be configured so that the light-emitting characteristic is changed every each file unit.

In the foregoing embodiments, although it has been shown that the LED elements which can be connected in series are arranged in the circular or elliptical mounting area, the mounting area is not limited to the foregoing shape, may have a polygonal shape or any shape. However, if the number of the LED elements arranged in files from a central portion toward a circumferential portion of the mounting area formed in a symmetrical shape is limited to be reduced, a circular shape, an elliptical shape, or diamond shape is suitable for a shape of the mounting area. Even if a plurality of LED elements are arranged by use of a mounting area having various shapes, it is possible to achieve a structure including a plurality of first electrode groups and second electrode groups as transit electrode groups corresponding to electrodes of the first electrode groups. Thereby, it is possible to acquire light-emitting effects of various manners while fitting with existing illumination instruments. Meanwhile, even if a square mounting area is used, it is possible to adjust brightness in a proper balance by broadening or narrowing intervals among the LED elements with a constant cycle.

Although the preferred embodiments of the present invention have been described, it should be understood that the present invention is not limited to these embodiments, various modifications and changes can be made to the embodiments by those skilled in the art as long as such modifications and changes are within the scope of the present invention as defined by the Claims.

What is claimed is:

1. A light-emitting device comprising:
   a mounting area including a first end and a second end opposite to the first end;
   a first electrode group adjacent to the first end of the mounting area;
   a second electrode group adjacent to the second end of the mounting area;
   a first file in that a plurality of light-emitting elements are arranged in the mounting area to extend from a vicinity of the first end of the mounting area to a vicinity of the second end of the mounting area and electrically connected in series with each other of the light-emitting elements of the first file;
   a second file disposed at a right side of the first file in parallel with the first file, the second file in that a plurality of light-emitting elements are arranged in the mounting area to extend from the vicinity of the first end of the mounting area to the vicinity of the second end of the mounting area and electrically connected in series with each other of the light-emitting elements of the second file;
   a third file disposed at a left side of the first file in parallel with the first file, the third file in that a plurality of light-emitting elements are arranged in the mounting area to extend from the vicinity of the first end of the mounting area to the vicinity of the second end of the mounting area and electrically connected in series with each other of the light-emitting elements of the third file; and
   a fourth file in that a plurality of light-emitting elements are arranged in the mounting area to extend from the vicinity of the first end of the mounting area to the vicinity of the second end of the mounting area and electrically connected in series with each other of the light-emitting elements of the fourth file,
   the first electrode group including a first electrode and a second electrode that are disposed adjacent to the first end of the mounting area, and
   the second electrode group including a first electrode as a transit electrode,
   a first light-emitting element included in the second file and positioned adjacent to the first end of the mounting area being electrically connected in series to the first electrode of the first electrode group, and a second light-emitting element included in the second file and positioned adjacent to the second end of the mounting area being electrically connected in series to the first electrode of the second electrode group,
   a first light-emitting element included in the third file and positioned adjacent to the first end of the mounting area being electrically connected in series to the second electrode of the first electrode group, and a second light-emitting element included in the third file and positioned adjacent to the second end of the mounting area being electrically connected in series to the first electrode of the second electrode group,
   the first electrode group including electrodes that are configured to be two or more entries of electrical current to the light-emitting elements arranged in the mounting area,
   the first electrode group further including a third electrode and a fourth electrode;
   the second electrode group further including a second electrode, and
   a first light-emitting element of the plurality of light-emitting elements included in the first file and positioned adjacent to the first end of the mounting area being electrically connected in series to the third electrode of the first electrode group, and a second light-emitting element of the plurality of light-emitting elements included in the first file and positioned adjacent to the second end of the mounting area being electrically connected in series to the second electrode of the second electrode group.

2. The light-emitting device according to claim 1:
   wherein the number of the light-emitting elements included in the first file is the same as the number of the light-emitting elements included in the fourth file.

3. The light-emitting device according to claim 2:
   wherein the first file and the fourth file are arranged side by side at a central portion of the mounting area.

4. The light-emitting device according to claim 1:
   wherein the light-emitting elements included in the first file and the light-emitting elements included in the fourth file are a light-emitting block to be lighted together.

5. The light-emitting device according to claim 1 further comprising:
   a fifth file in that a plurality of light-emitting elements are arranged in the mounting area to extend from the vicinity of the first end of the mounting area to the vicinity of the second end of the mounting area and electrically connected in series with each other of the light-emitting elements of the fifth file; and a sixth file in that a plurality of light-emitting elements are arranged in the mounting area to extend from the vicinity of the first end of the mounting area to the vicinity of the second end of the mounting area and electrically connected in series with each other of the light-emitting elements of the sixth file.

6. The light-emitting device according to claim 5:
a first light-emitting element of the plurality of light-emitting elements included in the fourth file and positioned adjacent to the first end of the mounting area is electrically connected in series to the fourth electrode of the first electrode group, and a second light-emitting element of the plurality of light-emitting elements included in the fourth file and positioned adjacent to the second end of the mounting area is electrically connected in series to the second electrode of the second electrode group; and
a first light-emitting element of the plurality of light-emitting elements included in the fifth file and positioned adjacent to the first end of the mounting area being electrically connected in series to the fourth electrode of the first electrode group, and a second light-emitting element of the plurality of light-emitting elements included in the fifth file and positioned adjacent to the second end of the mounting area being electrically connected in series to the third electrode of the second electrode group.

7. The light-emitting device according to claim 6:
wherein the light-emitting elements included in the first file, the light-emitting elements included in the fourth file, the light-emitting elements included in the fifth file, and the light-emitting elements included in the sixth file are a light-emitting block to be lighted together.

8. The light-emitting device according to claim 6:
wherein the light-emitting elements included in the second file, the light-emitting elements included in the third file, the light-emitting elements included in the fifth file, and the light-emitting elements included in the sixth file are a light-emitting block to be lighted together.

9. The light-emitting device according to claim 5:
the fifth file being positioned between the fourth file and the second file, and
the number of the light-emitting elements included in the fifth file being fewer than the number of the light-emitting elements included in the fourth file but being more than the number of the light-emitting elements included in the second file.

10. The light-emitting device according to claim 5:
the sixth file being positioned between the first file and the third file, and
the number of the light-emitting elements included in the sixth file being fewer than the number of the light-emitting elements included in the first file but being more than the number of the light-emitting elements included in the third file.

11. The light-emitting device according to claim 1 further comprising:
a fifth file disposed in parallel with the first file at a right side of the first file, the fifth file in that a plurality of light-emitting elements are arranged in the mounting area to extend from the vicinity of the first end of the mounting area to the vicinity of the second end of the mounting area, and electrically connected in series with each other of the light-emitting elements of the fifth file;
a sixth file disposed in parallel with the fifth file at a right side of the fifth file, the sixth file in that a plurality of light-emitting elements are arranged in the mounting area to extend from the vicinity of the first end of the mounting area to the vicinity of the second end of the mounting area, and electrically connected in series with each other of the light-emitting elements of the sixth file;
a seventh file disposed in parallel with the sixth file at a right side of the sixth file, the seventh file in that a plurality of light-emitting elements are arranged in the mounting area to extend from the vicinity of the first end of the mounting area to the vicinity of the second end of the mounting area, and electrically connected in series with each other of the light-emitting elements of the seventh file;
a first light-emitting element included in the fifth file and positioned adjacent to the first end of the mounting area being electrically connected in series to the fourth electrode of the first electrode group, and a second light-emitting element included in the fifth file and positioned adjacent to the second end of the mounting area being electrically connected in series to a first light-emitting element that is included in the sixth file and adjacent to the second end of the mounting area;
a second light-emitting element included in the sixth file and adjacent to the first end of the mounting area being electrically connected in series to a first light-emitting element that is included in the seventh file and adjacent to the first end of the mounting area; and
a second light-emitting element included in the seventh file and adjacent to the second end of the mounting area being electrically connected in series to the third electrode of the second electrode group.

12. The light-emitting device according to claim 11 further comprising:
an eighth file disposed in parallel with the first file at a left side of the first file, the eighth file in that a plurality of light-emitting elements are arranged in the mounting area to extend from the vicinity of the first end of the mounting area to the vicinity of the second end of the mounting area, and electrically connected in series with each other of the light-emitting elements of the eighth file;
a ninth file disposed in parallel with the eighth file at a left side of the eighth file, the ninth file in that a plurality of light-emitting elements are arranged in the mounting area to extend from the vicinity of the first end of the mounting area to the vicinity of the second end of the mounting area, and electrically connected in series with each other of the light-emitting elements of the ninth file;
a tenth file disposed in parallel with the ninth file at a left side of the ninth file, the tenth file in that a plurality of light-emitting elements are arranged in the mounting area to extend from the vicinity of the first end of the mounting area to the vicinity of the second end of the mounting area;
a first light-emitting element included in the eighth file and positioned adjacent to the first end of the mounting area being electrically connected in series to the second electrode of the first electrode group, and a second light-emitting element included in the eighth file and positioned adjacent to the second end of the mounting area being electrically connected in series to a first light-emitting element that is included in the ninth file and positioned adjacent to the second end of the mounting area;
a second light-emitting element included in the ninth file and adjacent to the first end of the mounting area being electrically connected in series to a first light-emitting element that is included in the tenth file and adjacent to the first end of the mounting area; and a second light-emitting element included in the tenth file and positioned adjacent to the second end of the mounting area being electrically connected in series to the third electrode of the second electrode group.

13. The light-emitting device according to claim 12:

wherein the light-emitting elements included in the fifth file, the light-emitting elements included in the sixth file, the light-emitting elements in the seventh file, the light-emitting elements in the eighth file, the light-emitting elements included in the ninth file, and the light-emitting elements included in the tenth file are electrically connected in series to the second electrode of the first electrode group and the fourth electrode of the first electrode group via the third electrode of the second electrode group.

14. The light-emitting device according to claim 13:

wherein the light-emitting elements included in the fifth file, the light-emitting elements included in the sixth file, the light-emitting elements included in the seventh file, the light-emitting elements included in the eighth file, the light-emitting elements included in the ninth file, the light-emitting elements included in the tenth file, the light-emitting elements included in the second file, and the light-emitting elements included in the third file are a light-emitting block to be lighted together.

15. The light-emitting device according to claim 13:

wherein the light-emitting elements included in the fifth file, the light-emitting elements included in the sixth file, the light-emitting elements included in the seventh file, the light-emitting elements included in the eighth file, the light-emitting elements included in the ninth file, the light-emitting elements included in the tenth file, the light-emitting elements included in the first file, and the light-emitting elements included in the fourth file are a light-emitting block to be lighted together.

16. A light-emitting device comprising:

a mounting area including a first end and a second end opposite to the first end;

a first electrode group adjacent to the first end of the mounting area;

a second electrode group adjacent to the second end of the mounting area;

a first file in that a plurality of light-emitting elements are arranged in the mounting area to extend from a vicinity of the first end of the mounting area to a vicinity of the second end of the mounting area and electrically connected in series with each other of the light-emitting elements of the first file;

a second file disposed at a right side of the first file in parallel with the first file, the second file in that a plurality of light-emitting elements are arranged in the mounting area to extend from the vicinity of the first end of the mounting area to the vicinity of the second end of the mounting area and electrically connected in series with each other of the light-emitting elements of the second file;

a third file disposed at a left side of the first file in parallel with the first file, the third file in that a plurality of light-emitting elements are arranged in the mounting area to extend from the vicinity of the first end of the mounting area to the vicinity of the second end of the mounting area and electrically connected in series with each other of the light-emitting elements of the third file; and, a fourth file disposed in parallel with the first file at a left side of the first file, the fourth file in that a plurality of light-emitting elements are arranged in the mounting area to extend from the vicinity of the first end of the mounting area to the vicinity of the second end of the mounting area, and electrically connected in series with each other of the light-emitting elements of the fourth file, the first electrode group including a first electrode and a second electrode that are disposed adjacent to the first end of the mounting area, the second electrode group including a first electrode as a transit electrode, a first light-emitting element included in the second file and positioned adjacent to the first end of the mounting area being electrically connected in series to the first electrode of the first electrode group, and a second light-emitting element included in the second file and positioned adjacent to the second end of the mounting area being electrically connected in series to the first electrode of the second electrode group, a first light-emitting element included in the third file and positioned adjacent to the first end of the mounting area being electrically connected in series to the second electrode of the first electrode group, and a second light-emitting element included in the third file and positioned adjacent to the second end of the mounting area being electrically connected in series to the first electrode of the second electrode group, the first electrode group including electrodes that are configured to be two or more entries of electrical current to the light-emitting elements arranged in the mounting area, the first electrode group further including a third electrode and a fourth electrode, the second electrode group further including a second electrode, a first light-emitting element included in the first file and positioned adjacent to the first end of the mounting area being electrically connected in series to the third electrode of the first electrode group, a first light-emitting element included in the fourth file and positioned adjacent to the first end of the mounting area being electrically connected in series to the fourth electrode of the first electrode group, and a second light-emitting element included in the first file and positioned adjacent to the second end of the mounting area being electrically connected in series to a second light-emitting element included in the fourth file and positioned adjacent to the second end of the mounting area.

17. A light-emitting device comprising:

a mounting area including a first end and a second end opposite to the first end;

a first electrode group adjacent to the first end of the mounting area;

a second electrode group adjacent to the second end of the mounting area;

a first file in that a plurality of light-emitting elements are arranged in the mounting area to extend from a vicinity of the first end of the mounting area to a vicinity of the second end of the mounting area and electrically connected in series with each other of the light-emitting elements of the first file;

a second file disposed at a right side of the first file in parallel with the first file, the second file in that a plurality of light-emitting elements are arranged in the mounting area to extend from the vicinity of the first end of the mounting area to the vicinity of the second end of the mounting area and electrically connected in series with each other of the light-emitting elements of the second file;
a third file disposed at a left side of the first file in parallel with the first file, the third file in that a plurality of light-emitting elements are arranged in the mounting area to extend from the vicinity of the first end of the mounting area to the vicinity of the second end of the mounting area and electrically connected in series with each other of the light-emitting elements of the third file; and
a fourth file in that a plurality of light-emitting elements are arranged in the mounting area to extend from the vicinity of the first end of the mounting area to the vicinity of the second end of the mounting area and electrically connected in series with each other of the light-emitting elements of the fourth file,
the first electrode group including a first electrode and a second electrode that are disposed adjacent to the first end of the mounting area,
the second electrode group including a first electrode as a transit electrode,
a first light-emitting element included in the second file and positioned adjacent to the first end of the mounting area being electrically connected in series to the first electrode of the first electrode group, and a second light-emitting element included in the second file and positioned adjacent to the second end of the mounting area being electrically connected in series to the first electrode of the second electrode group,
a first light-emitting element included in the third file and positioned adjacent to the first end of the mounting area being electrically connected in series to the second electrode of the first electrode group, and a second light-emitting element included in the third file and positioned adjacent to the second end of the mounting area being electrically connected in series to the first electrode of the second electrode group,
the first electrode group including electrodes that are configured to be two or more entries of electrical current to the light-emitting elements arranged in the mounting area,
the first electrode group further including a third electrode,
the second electrode group further including a second electrode,
a first light-emitting element of the plurality of light-emitting elements included in the first file and positioned adjacent to the first end of the mounting area being electrically connected in series to the third electrode of the first electrode group, and a second light-emitting element of the plurality of light-emitting elements included in the first file and positioned adjacent to the second end of the mounting area being electrically connected in series to the second electrode of the second electrode group, and
a first light-emitting element of the plurality of light-emitting elements included in the fourth file and positioned adjacent to the first end of the mounting area being electrically connected in series to the first electrode of the first electrode group, and a second light-emitting element of the plurality of light-emitting elements included in the fourth file and positioned adjacent to the second end of the mounting area being electrically connected in series to the second electrode of the second electrode group.

* * * * *